US010727088B2

(12) United States Patent
Morimoto et al.

(10) Patent No.: US 10,727,088 B2
(45) Date of Patent: *Jul. 28, 2020

(54) PLASMA PROCESSING APPARATUS AND PLASMA PROCESSING METHOD

(71) Applicant: HITACHI HIGH-TECHNOLOGIES CORPORATION, Tokyo (JP)

(72) Inventors: Michikazu Morimoto, Yamaguchi (JP); Yasuo Ohgoshi, Yamaguchi (JP); Yuuzou Oohirabaru, Yamaguchi (JP); Tetsuo Ono, Yamaguchi (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 393 days.

This patent is subject to a terminal disclaimer.

(21) Appl. No.: 15/284,668

(22) Filed: Oct. 4, 2016

(65) Prior Publication Data
US 2017/0025289 A1   Jan. 26, 2017

Related U.S. Application Data

(62) Division of application No. 13/743,367, filed on Jan. 17, 2013, now abandoned.

(30) Foreign Application Priority Data

Aug. 24, 2012 (JP) ................................. 2012-184847

(51) Int. Cl.
*H01L 21/00*  (2006.01)
*H01L 21/67*  (2006.01)
(Continued)

(52) U.S. Cl.
CPC .. *H01L 21/67069* (2013.01); *H01J 37/32082* (2013.01); *H01J 37/32165* (2013.01);
(Continued)

(58) Field of Classification Search
USPC ....................................... 156/345.24–345.28
See application file for complete search history.

(56) References Cited

U.S. PATENT DOCUMENTS

| 4,941,152 A | 7/1990 | Medan |
| 6,535,785 B2 | 3/2003 | Johnson et al. |

(Continued)

FOREIGN PATENT DOCUMENTS

| JP | 62-57321 A | 3/1987 |
| JP | 07037818 | * 2/1995 |

(Continued)

OTHER PUBLICATIONS

English Machine Translation, JP07037818_Ishikawa et al (Year: 1995).*

*Primary Examiner* — Rakesh K Dhingra
(74) *Attorney, Agent, or Firm* — Baker Botts L.L.P.

(57) ABSTRACT

The present invention provides a plasma processing apparatus having a radio frequency power supply supplying time-modulated radio frequency power which is controllable widely with high precision, and a plasma processing method using the plasma processing apparatus. The plasma processing apparatus includes: a vacuum chamber; a first radio frequency power supply for generating plasma in the vacuum chamber; a sample holder disposed in the vacuum chamber, on which a sample is placed; and a second radio frequency power supply supplying radio frequency power to the sample holder, wherein at least one of the first radio frequency power supply and the second radio frequency power supply supplies time-modulated radio frequency power, one of parameters of controlling the time-modulation has two or more different control ranges, and one of the control ranges is a control range for a high-precision control.

8 Claims, 15 Drawing Sheets

(51) Int. Cl.
*H01L 21/3065* (2006.01)
*H01L 21/3213* (2006.01)
*H01L 21/311* (2006.01)
*H01J 37/32* (2006.01)

(52) U.S. Cl.
CPC .. *H01J 37/32192* (2013.01); *H01J 37/32302* (2013.01); *H01J 37/32706* (2013.01); *H01J 37/32715* (2013.01); *H01L 21/3065* (2013.01); *H01L 21/31116* (2013.01); *H01L 21/32137* (2013.01); *H01J 2237/334* (2013.01)

(56) References Cited

U.S. PATENT DOCUMENTS

| | | |
|---|---|---|
| 2002/0123237 A1 | 9/2002 | Nguyen et al. |
| 2003/0132198 A1 | 7/2003 | Ono et al. |
| 2004/0157444 A1 | 8/2004 | Chiu et al. |
| 2005/0171992 A1 | 8/2005 | Tanaka et al. |
| 2007/0175856 A1 | 8/2007 | Johnson et al. |
| 2009/0284156 A1 | 11/2009 | Banna et al. |
| 2010/0213162 A1 | 8/2010 | Mochiki et al. |
| 2014/0305905 A1* | 10/2014 | Yamada ............ H01J 37/32091 216/71 |

FOREIGN PATENT DOCUMENTS

| | | |
|---|---|---|
| JP | 8-250479 A | 9/1996 |
| JP | 2001-85395 A | 3/2001 |
| JP | 2007-509506 A | 4/2007 |

\* cited by examiner

ANALOG SIGNAL EXAMPLE 1

ANALOG SIGNAL EXAMPLE 1

PLASMA PROCESSING APPARATUS AND PLASMA PROCESSING METHOD

CLAIM OF PRIORITY

This application is a division of U.S. patent application Ser. No. 13/743,367 filed on Jan. 17, 2013, which claims priority from Japanese patent application JP2012-184847 filed on Aug. 24, 2012, the contents of both of which are hereby incorporated by reference into this application.

FIELD OF THE INVENTION

The present invention relates to a plasma processing apparatus and a plasma processing method, and particularly, to a plasma processing apparatus and a plasma processing method suitable to perform high-precision etching processing by using plasma in order to process a sample such as a semiconductor device, and the like.

BACKGROUND OF THE INVENTION

In the related art, as a method of processing the surface of a semiconductor device, an apparatus that etches the semiconductor device with plasma is known. Herein, the related art will be described by using as an example a plasma etching apparatus of an electron cyclotron resonance (ECR, hereinafter, abbreviated as ECR) type.

In the ECR type, plasma is generated by a microwave in a vacuum chamber to which a magnetic field is applied from the outside. Electrons cyclotron-move by the magnetic field, and this frequency and a frequency of the microwave are resonated to efficiently generate plasma. In order to accelerate ions incident on the semiconductor device, radio frequency power is applied to a sample as an approximate sine wave in a continuous waveform. Herein, the radio frequency power applied to the sample is hereinafter referred to as a radio frequency bias.

Further, as gas which becomes plasma, halogen gas such as chlorine or fluorine has been widely used. An etched material reacts with radicals or ions generated by plasma, and thus etching is performed. A reaction product produced by etching causes reattachment to a pattern and an etching profile is a taper profile. Therefore, controlling the reaction product produced in etching becomes important in order to achieve high-precision of etching processing.

In order to decrease the concentration of the reaction product, a method of shortening a residence time of the reaction product is used. In the case where a residence time of gas in a plasma processing chamber is set as τ, τ has a relationship of τ=PV/Q when P is set as processing pressure, V is set as the volume of the plasma processing chamber, and Q is set as a gas flow rate, and in a device configuration, limitations of P, V, and Q are determined.

The residence time of the reaction product which becomes gas may be shortened by decreasing the processing pressure or increasing the gas flow rate from the above relationship, but the increasing the gas flow rate and the decreasing the processing pressure have a trade-off relationship with each other, which are difficult to be enhanced.

Further, Japanese Patent Application Laid-Open Publication No. Hei8(1996)-250479 discloses time-modulation of plasma or radio frequency bias as a method of controlling the reaction product and increasing etching processing precision. In addition, Japanese Patent Application Laid-open Publication No. 2001-85395 discloses a method of controlling a time-modulated radio frequency bias to control ion energy with high precision by dividing the radio frequency bias into two or more.

SUMMARY OF THE INVENTION

When etching is performed, the repetition frequency and the duty ratio and an etching condition such as etching gas or pressure are set in a controller by an input means. A set value is handled as a digital signal in the controller, but when the controller and the radio frequency bias power supply are analogly connected to each other, the set value needs to be converted into an analog signal through a digital/analog converter (hereinafter, referred to as a D/A converter) in the controller and thereafter, transmitted. When an error occurs due to noise for the signal, and the like at the time of transmitting the analog signal, the set value becomes different from an output value.

For example, when a signal of the duty ratio may be input every 0.5% in the range of 0 to 100%, resolution of approximately 0.098% per one digit is obtained in 12-bit digital signal processing. Herein, the digit means a binary digit number.

As illustrated in FIG. 11, when the analog signal is used in the range of 0 to 10 V with respect to the 12-bit digital signal processing, voltage per one digit is approximately 4.9 mV. When the analog signal deviates by 4.9 mV or more due to the noise, and the like, deviation of one digit or more may occur after digital signal conversion. In this case, since the resolution is approximately 0.098% per one digit, an error of the duty ratio of approximately 0.1% or more may occur.

For example, when the repetition frequency is 10 Hz and the duty ratio is 2.0%, the on-time of the radio frequency bias becomes 2.0 ms. When the repetition frequency is 10 Hz and the duty ratio 2.1%, the on-time becomes 2.1 ms. When an error of control precision of the duty ratio is 0.1%, the set value of the duty ratio may also be 2.0%, and as a result, 2.1% and in this case, an error of the on-time becomes 0.1 ms.

In general, etching is performed during the on-time. An error of the time during which etching is performed influences an etching rate or the concentration of the reaction product of etching. FIG. 12 illustrates a test result acquired by verifying the relationship between the duty ratio and the etching rate. In the case of the etching rate, by using mixed gas of HBr gas, Ar gas, and $O_2$ gas, an etching rate of Poly-Si is measured by changing the duty ratio at a repetition frequency of 10 Hz.

In this test, a result in which when the duty ratio is changed by 0.1%, the etching rate is changed by 1.3 nm/min is acquired. Further, when the duty ratio is 2%, the etching rate is 21.7 nm/min, but when the duty ratio deviates by +1 digit due to noise, and the like, the duty ratio becomes 2.1% and the etching rate becomes 23.0 nm/min. In addition, when the duty ratio deviates by one digit due to noise, and the like, the duty ratio becomes 1.90% and the etching rate becomes 20.4 nm/min.

As such, when an error of ±1 digit occurs even in a state where the duty ratio is set to 2.0%, the etching rate has an error of approximately 12% as an error rate with respect to 21.7 nm/min and variation in etching performance of approximately 12% may occur. The variation causes reproducibility of etching performance or an interdevice difference.

Resolution may be increased by narrowing a use domain of a duty ratio for an analog voltage value used with respect to this problem, but an optimal duty ratio is different according to etching gas or an etched target structure. As a result, in order to deal with various etching gas or various etched target structures, a duty ratio domain which is as large as possible is required. Therefore, both broadness of a usable domain of the duty ratio and improvement of the resolution of the duty ratio are required.

Further, the same as the duty ratio applies even to the repetition frequency. Since the optimal repetition frequency is different according to the etching gas or the etching target structure, a repetition frequency domain which is as large as possible is required in order to deal with various etching gases or various etching target structures. As a result, both broadness and high resolution of the repetition frequency are required even with respect to the repetition frequency.

In addition, even with respect to pulse plasma which is known as a method of controlling dissociation of plasma, a high frequency applied to produce the pulse plasma is time-modulated and pulsated, and thus the same problem as in the duty ratio and the repetition frequency may occur.

Therefore, in consideration of the above problem, the present invention provides a plasma processing apparatus including a radio frequency power supply supplying time-modulated radio frequency power which is controllable extensively and with high precision, and a plasma processing method using the plasma processing apparatus.

The present invention provides a plasma processing apparatus including: a vacuum chamber; a first radio frequency power supply for generating plasma in the vacuum chamber; a sample holder disposed in the vacuum chamber, on which a sample is placed; and a second radio frequency power supply supplying radio frequency power to the sample holder, wherein at least one of the first radio frequency power supply and the second radio frequency power supply supplies time-modulated radio frequency power, one of parameters of controlling the time-modulation has two or more different control ranges, and one of the control ranges is a control range for a high-precision control.

The present invention also provides a plasma processing method using a plasma processing apparatus including: a vacuum chamber; a first radio frequency power supply for generating plasma in the vacuum chamber; a sample holder disposed in the vacuum chamber, on which a sample is placed; and a second radio frequency power supply supplying radio frequency power to the sample holder, wherein at least one of the first radio frequency power supply and the second radio frequency power supply supplies time-modulated radio frequency power, the time-modulation is controlled by a parameter having two or more different control ranges, and one of the control ranges is a control range for a high-precision control.

The present invention also provides a plasma processing method in which a sample having a Poly-Si film, a $SiO_2$ film, an amorphous carbon film, a SiN film, and a BARC film is plasma-etched while time-modulated radio frequency power is supplied to the sample, wherein a repetition frequency has a first control range requiring a high-precision control and a second control range not requiring the high-precision control, a duty ratio has a third control range requiring the high-precision control and a fourth control range not requiring the high-precision control, the SiN film is etched in the first control range and the fourth control range, the amorphous carbon film is etched in the second control range and the fourth control range, the $SiO_2$ film is etched in the first control range and the third control range, and a part of the Poly-Si film is etched in the first control range and the third control range.

According to the aspects of the present invention, it is possible to supply time-modulated radio frequency power which is controllable extensively and with high precision.

DETAILED DESCRIPTION OF THE PREFERRED EMBODIMENTS

Controlling parameters when time-modulating radio frequency power supplied from at least one radio frequency power supply of a radio frequency power supply for generating plasma and a radio frequency power supply that supplies the radio frequency power to a sample include a repetition frequency, a duty ratio, a time (for example, an on-time) during a period when an amplitude of a repetition waveform is high, and a time (for example, an off-time) during a period when the amplitude of the repetition waveform is low. The present invention is characterized in that at least one control range of the controlling parameter is divided into at least two different domains and the one domain is a domain that needs to be controlled with high precision.

Figure 15:
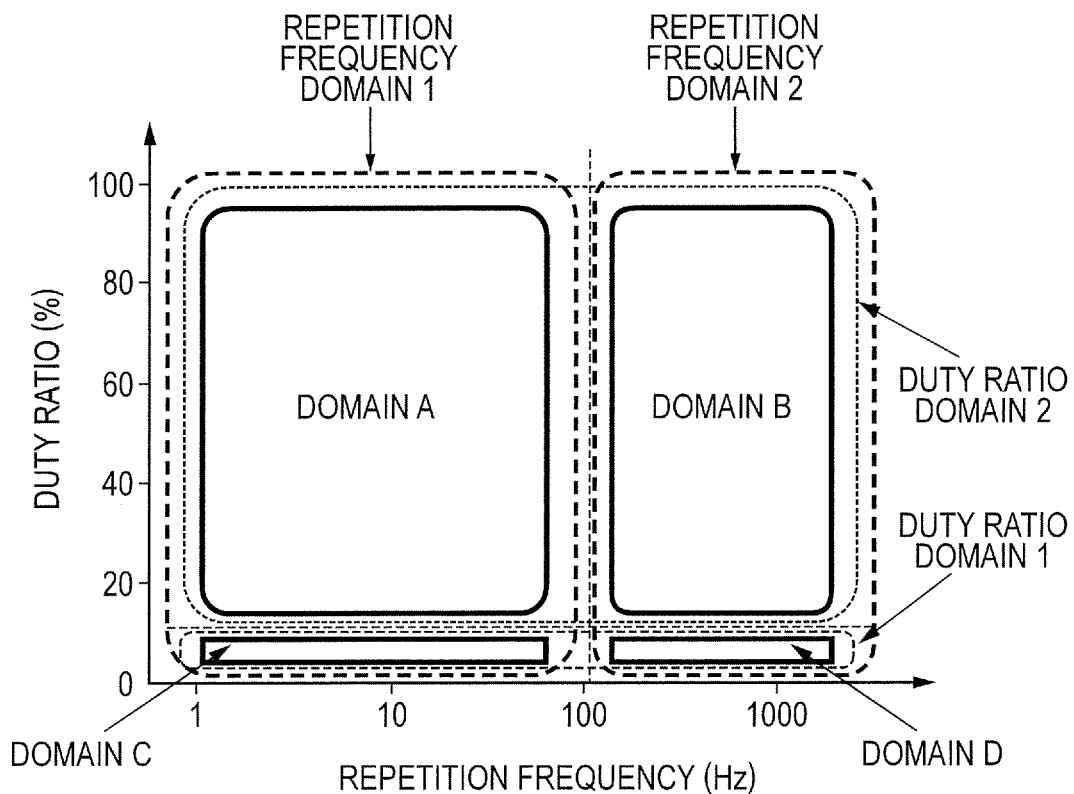
FIG. 15 is a diagram illustrating a concept of the present invention.

For example, when the radio frequency power supplied from the radio frequency power supply that supplies the radio frequency power to a sample by using the repetition frequency and the duty ratio as the controlling parameters is time-modulated, the radio frequency power may be generally divided into four domains as illustrated in FIG. 15.

A domain A is a domain having a low repetition frequency (for example, a repetition frequency of 1 to 100 Hz) and a higher duty ratio than a low duty ratio (for example, a duty ratio of 10% or less) and a domain B is a domain having a higher repetition frequency than the low repetition frequency and the higher duty ratio than the low duty ratio. Further, a domain C is a domain having the low repetition frequency and the low duty ratio and a domain D is a domain having the higher repetition frequency than the low repetition frequency and the low duty ratio.

In addition, the low repetition frequency and the low duty ratio are ranges that need to be controlled with high precision. As a result, the present invention is characterized in that, when the radio frequency power supplied from at least one radio frequency power supply of the radio frequency power supply for generating plasma and the radio frequency power supply that supplies the radio frequency power to the sample is time-modulated, the controlling domain of the time-modulation of the radio frequency power is constituted by a plurality of different domains and at least one of the plurality of different domains is at least one domain of the domains A, C, and D.

First, when the radio frequency power supplied from the radio frequency power supply that supplies the radio frequency power to the sample is time-modulated and the duty ratio is set as a control parameter, an embodiment in which a duty-ratio domain 1 constituted by the domains C and D and the duty-ratio domain 2 constituted by the domains A and B are set as control domains will be described below.

First Embodiment

Figure 1:
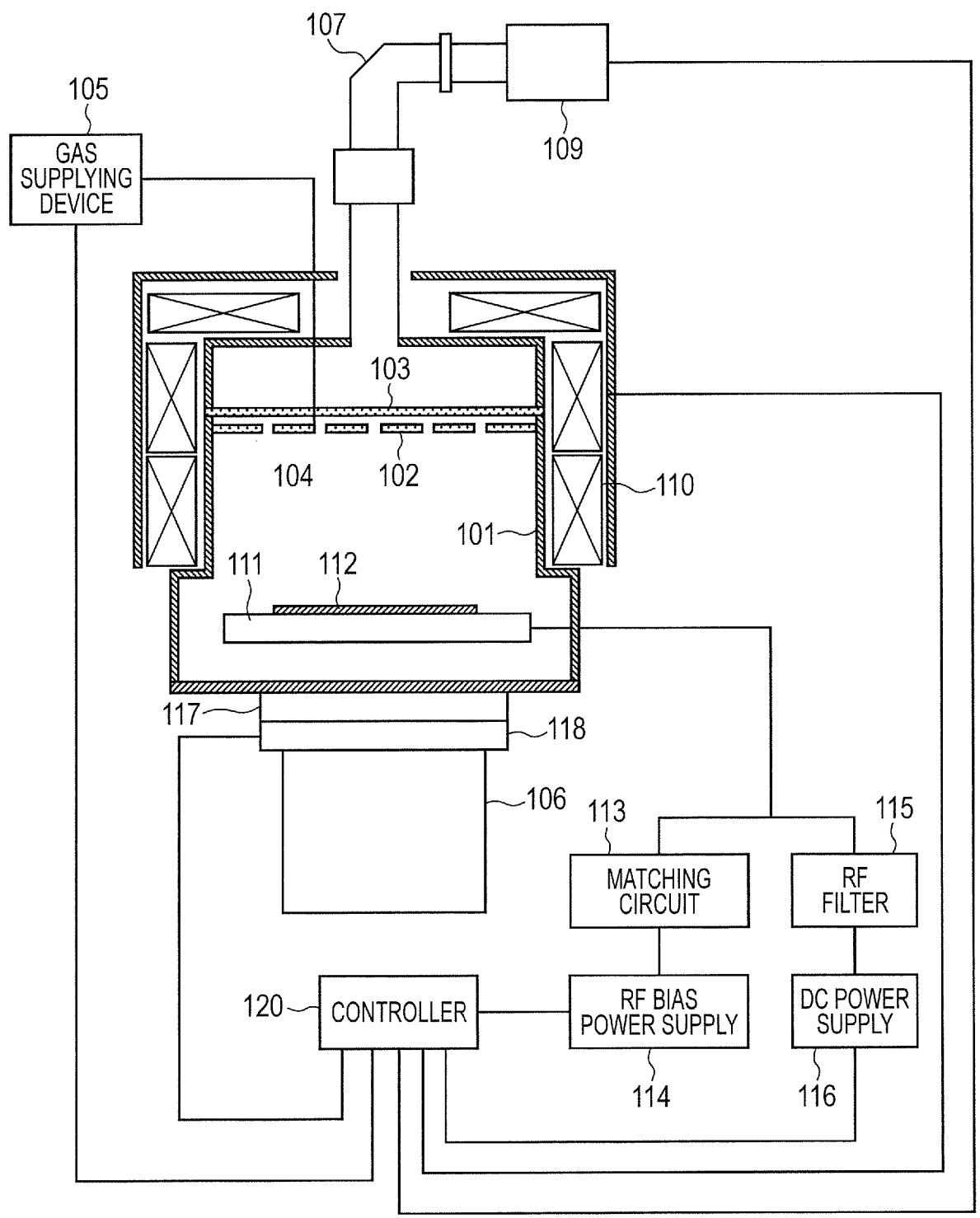
FIG. 1 is a longitudinal cross-sectional view of a microwave ECR plasma etching apparatus according to an embodiment of the present invention.

Hereinafter, embodiments of the present invention will be described with reference to the accompanying drawings. FIG. 1 is a schematic longitudinal cross-sectional view of an ECR plasma etching apparatus using a microwave according to an embodiment of the present invention. Further, like reference numerals refer to like elements.

A shower plate 102 (made of, for example, quartz) for introducing etching gas into a vacuum chamber 101 and a dielectric window 103 (made of, for example, quartz) are installed and sealed to form a processing chamber 104, on the top of the vacuum chamber 101 of which the top is opened. A gas supplying device 105 for making the etching gas flow is connected to the shower plate 102. Further, a vacuum exhaust device 106 is connected to the vacuum chamber 101 through an exhaust opening/closing valve 117 and an exhaust speed variable valve 118. The processing chamber 104 is depressurized by driving the vacuum exhaust device 106 with the exhaust opening/closing valve 117 being opened, to be in a vacuum state. The pressure in the processing chamber 104 is adjusted to desired pressure by the exhaust speed variable valve 118. The etching gas is introduced into the processing chamber 104 from the gas supplying device 105 through the shower plate 102 and exhausted by the vacuum exhaust device 106 through the exhaust speed variable valve 118. Further, a sample holder 111 which concurrently serves as a sample stage is provided in a lower part of the vacuum chamber 101 which faces the shower plate 102.

In order to transmit power for generating plasma to the processing chamber 104, a waveguide 107 configured to transmit an electromagnetic wave is provided above the dielectric window 103. The electromagnetic wave transmitted to the waveguide 107 is oscillated from an electromagnetic wave generation power supply 109. Further, an effect of the embodiment is not particularly limited to a frequency of the electromagnetic wave, but in the embodiment, a microwave of 2.45 GHz is used. A magnetic field generation coil 110 forming a magnetic field is provided outside the processing chamber 104, and high-density plasma is generated in the processing chamber 104 by interaction of the electromagnetic wave oscillated from the electromagnetic wave generation power supply 109 and the magnetic field formed by the magnetic field generation coil 110, and etching processing is performed with respect to a wafer 112 which is a sample disposed on the sample holder 111.

Since the shower plate 102, the sample holder 111, the magnetic field generation coil 110, the exhaust opening/closing valve 117, the exhaust speed variable valve 118, and the wafer 112 are coaxially disposed on a central axis of the processing chamber 104, the flow of the etching gas, the radicals and ions generated by plasma, and the reaction product generated by etching are introduced and exhausted axially with respect to the wafer 112. The coaxial disposition provides an effect to approximate wafer in-plane uniformity of an etching rate and an etching profile to axial symmetry and improve wafer processing uniformity.

The surface of the sample holder 111 is coated with a sprayed film (not illustrated) and a DC power supply 116 is connected to the sample holder 111 through a radio frequency filter 115. Further, a radio frequency (RF) bias power supply 114 is connected to the sample holder 111 through a matching circuit 113. The radio frequency bias power supply 114 includes a radio frequency bias output unit 126 and a pulse generator 108 (see FIG. 2), and may selectively supply time-modulated intermittent radio frequency power or continuous radio frequency power to the sample holder 111. Further, the time-modulated intermittent radio frequency bias power is controlled by a repetition frequency which is the number of times when an application period (on-period) of the radio frequency bias power and a non-application period (off-period) of the radio frequency bias power are repeated per unit time and a duty ratio which is an on-period per one cycle (the reciprocal of the repetition frequency).

A controller 120 that controls etching processing using the aforementioned ECR etching apparatus includes a personal computer 121 that processes a repetition frequency, a duty ratio, and etching parameters such as a gas flow rate, processing pressure, microwave power, coil current, and the like to perform etching, which are input by an input means (not illustrated), a microcomputer 122 that performs signal processing, and a digital/analog converter (hereinafter, referred to as a D/A converter 123) that converts a digital signal into an analog signal (see FIG. 2).

Further, the radio frequency bias power supply 114 includes an analog/digital converter (hereinafter, referred to as an A/D converter 124) that converts the analog signal into the digital signal, a signal processor 125 that processes a signal transmitted from the microcomputer 122 and a signal transmitted from the A/D converter 124, the pulse generator 108 that generates pulse waveforms of the repetition frequency and the duty ratio commanded from the signal processor 125, and the radio frequency bias output unit 126 that outputs radio frequency bias commanded from the signal processor (see FIG. 2).

Hereinafter, a function of the controller 120 when the time-modulated intermittent radio frequency power is supplied from the radio frequency bias power supply 114 to the sample holder will be described with reference to FIG. 2.

The repetition frequency and the duty ratio which are input into the personal computer 121 by the input means (not illustrated) are processed by the microcomputer 122 as the digital signals and converted into the analog signals through the D/A converter 123 to be transmitted to the radio frequency bias power supply 114. The analog signals received by the radio frequency bias power supply 114 are converted into the digital signals by the A/D converter 124, which are processed by the signal processor 125 and controlled by software. As a result, the radio frequency bias power and the pulse waveform are output from the radio frequency bias output unit 126 and the pulse generator 108, respectively. The output pulse waveform overlaps with the output radio frequency bias power to supply the time-modulated intermittent radio frequency power from the radio frequency bias power supply 114 to the sample holder 111.

Subsequently, a case in which a duty ratio of the radio frequency bias power supply 114 is used by setting the range of 0 to 100% every 0.5%, and particularly, a case where a domain of a duty ratio of 0 to 10% is controlled with high resolution will be described.

The domain of the duty ratio of 0 to 10% is set as a channel 1 and a domain of a duty ratio of 10.5 to 100% is set as a channel 2. Further, the D/A converter 123 and the A/D converter 124 of 12 bits are used, and a voltage value of the analog signal is set to a range of ±10 V. In addition, when the analog signal is in the range of ±10 V, the analog signal of 0 to 10 V is generally used. The range of the analog voltage value may be set to a predetermined range, but in the embodiment, 0 to 10 V which is generally used is used.

Figure 3A:
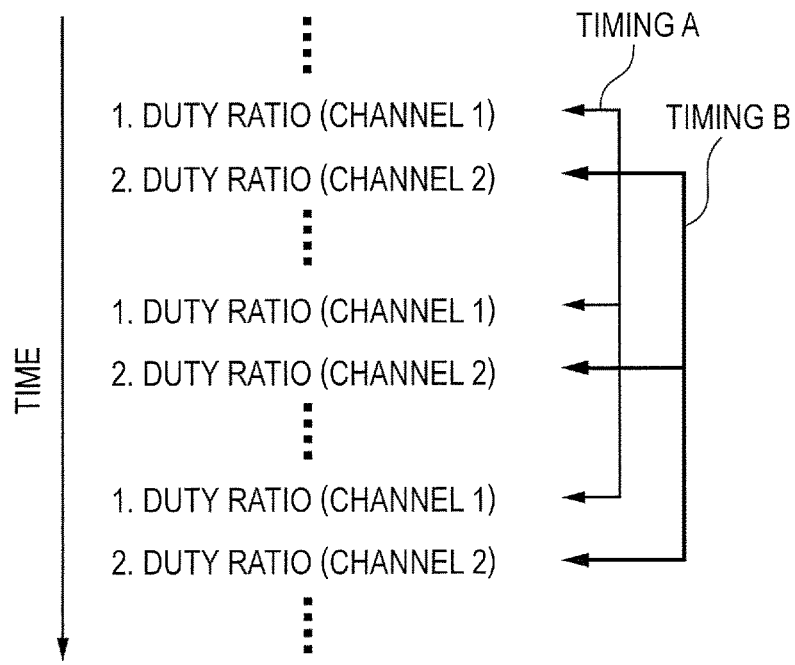
FIG. 3A is a diagram illustrating transmission of an analog signal in a first embodiment.

For example, when a duty ratio of 2% is input into the personal computer 121, both signals of the channel 1 and the channel 2 are periodically transmitted to the A/D converter 124 from the microcomputer 122 through the D/A converter 123 with timings of both sides deviating from each other, as illustrated in FIG. 3A. The signal processor 125 selects the signal of the channel 1 from the signals of the channel 1 and the channel 2 transmitted from the A/D converter 124 by synchronizing a timing A (the channel 1) and signal reception with each other according to a channel switching signal for selecting the channel 1 transmitted from the microcomputer 122.

The signal processor 125 that selects the signal of the channel 1 generates a pulse waveform of a duty ratio of 2% from the pulse generator 108 and outputs time-modulated intermittent radio frequency power of the duty ratio of 2% from the radio frequency bias power supply 114.

Figure 4A:
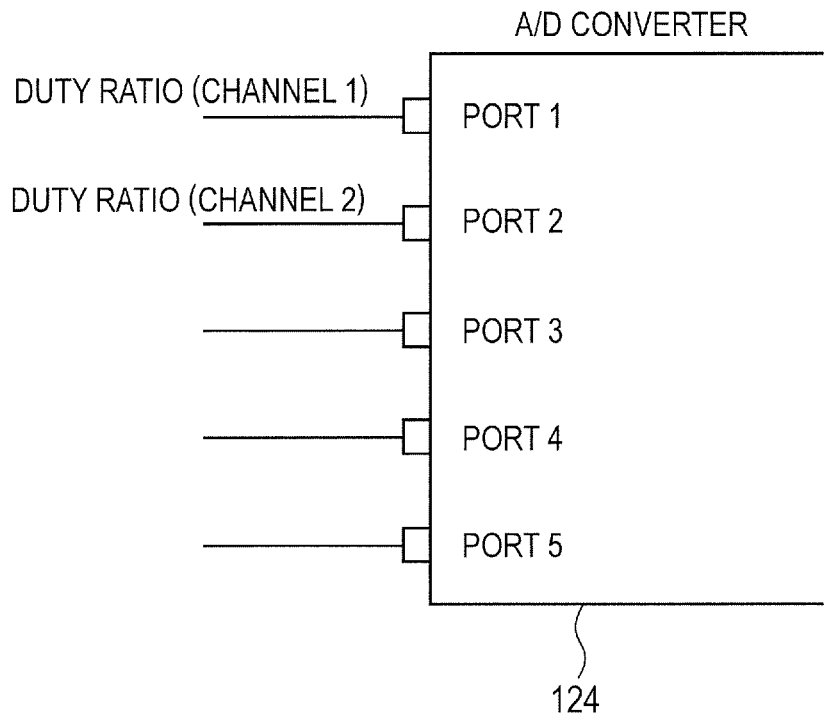
FIG. 4A is a schematic diagram of an A/D converter in the first embodiment.

Further, as another method for the signal processor 125 to select the channel, a method of judging which channel will be selected by the channel switching signal and acquiring a signal of a predetermined port may be used when a plurality of input/output terminals (hereinafter, referred to as ports) is provided in the A/D converter 124, as illustrated in FIG. 4A. For example, in the case of the duty ratio of 2%, the signal processor 125 is judged to select a port 1 (FIG. 4A).

Figure 5:
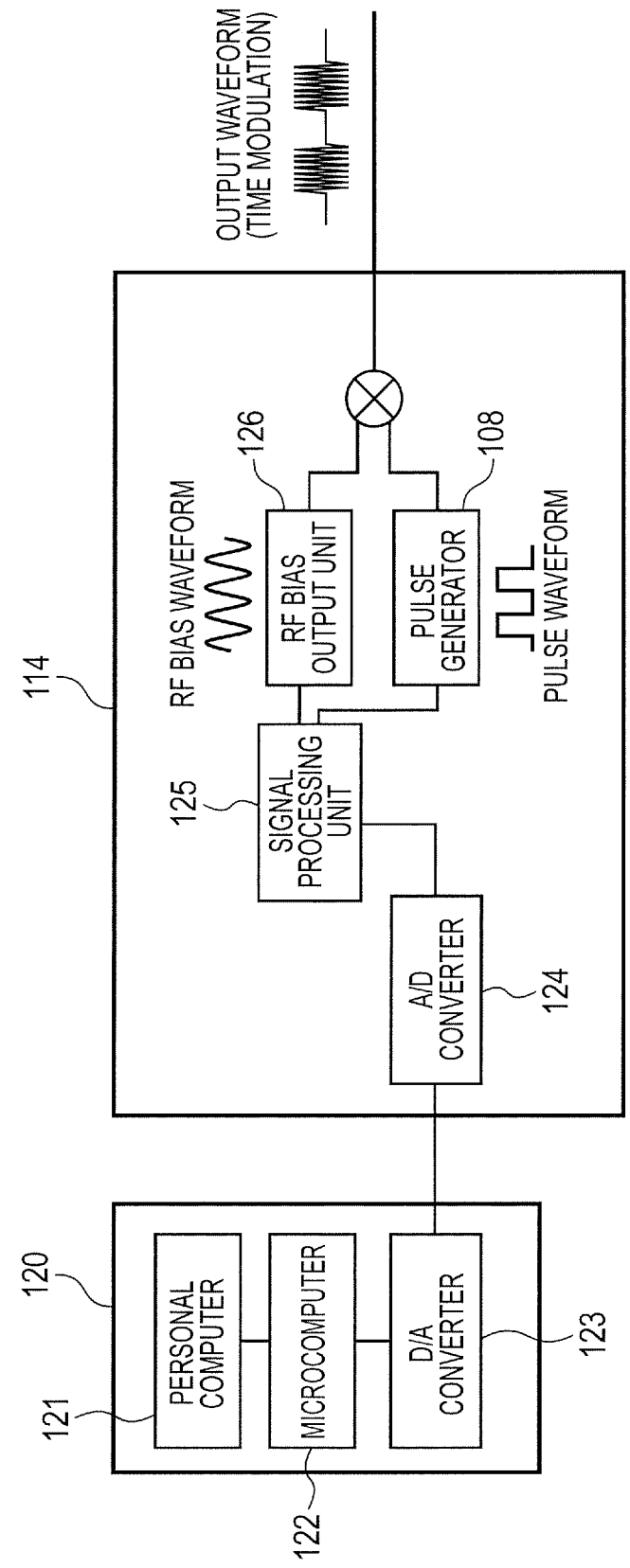
FIG. 5 is a schematic diagram of a controller and a radio frequency bias power supply according to the embodiment of the present invention.

Further, only a used channel may be transmitted to the A/D converter 124 from the microcomputer 122 through the D/A converter 123. For example, when the duty ratio of 2% is set, only the signal of the channel 1 is transmitted and the signal of the channel 2 is not transmitted. When the A/D converter 124 has a configuration illustrated in FIG. 4A, the signal processor 125 judges whether there is a reception signal of a port and thus may select the port 1, that is, the channel 1 in a state in which the port 1 has a signal and the port 2 has no signal. In this case, since the channel switching signal is not required, the A/D converter 124 may have a configuration of FIG. 5.

However, etching may be continuously processed in a plurality of steps, and when domains (different channels) of different duty ratios are used between the respective steps, the channel may be changed more rapidly in the method (FIG. 4A) of selecting the channel by using the switching signal in the state in which signals of different channels are transmitted periodically at all times while transmission timings deviate from each other than a method not requiring the switching signal, and thus the channel selecting method of FIG. 4A is appropriate.

Subsequently, duty ratios and resolutions of the channel 1 and the channel 2 in the embodiment will be described.

In general, the resolution of the duty ratio is determined by processing capability and ranges of the domains of the duty ratios of the D/A converter 123 and the A/D converter 124. The D/A converter 123 and the A/D converter 124 of 12 bits may handle signals of 4096 digits. The digit means a binary digit number. In this case, signal values of 4096 types may be handled in the range of the analog signal of ±10 V. The analog signal is in the range of 0 to 10 V in the embodiment and signal values of 2048 types may be handled.

In the embodiment, since a use range of the duty ratio of the channel 1 is set every 0.5% in the range of 0 to 10%, the resolution is approximately 0.01%. Further, since a use range of the duty ratio of the channel 2 is 10.5 to 100%, the resolution is approximately 0.09%. In addition, since the signals of 2048 digits may be handled as the use range of the analog signal is 10 V, 1 digit corresponds to approximately 4.9 mV. That is, when the analog signal is at approximately 4.9 mV, the duty ratio shows approximately 0.01% in the case of the channel 1 and the duty ratio shows approximately 0.09% in the case of the channel 2. As a result, when an error of 4.9 mV occurs in the analog signal, an error of approximately 0.01% occurs in the case of the channel 1 and an error of approximately 0.09% occurs in the case of the channel 2.

For example, when the duty ratio is 2% (channel 1) and the repetition frequency is 10 Hz, the on-time is 2.0 ms. When noise of approximately 0.05% (5 mV) occurs in the analog signal, an error of approximately 0.01% or more occurs in the duty ratio. When the repetition frequency is 10 Hz at a duty ratio of 2.01%, the on-time is 2.01 ms and the error is just 0.01 ms.

Further, when the duty ratio is 90% (channel 2) and the repetition frequency is 10 Hz, the on-time is 9.0 ms. When noise of approximately 0.09 (5 mV) occurs in the analog signal by noise, the analog signal is processed as a signal of approximately 90.09%, and the error is 0.09 ms at the on-time of 9.09 ms, and thus the error is just 0.09 ms.

Accordingly, in the embodiment, as described above, the use domain range of the duty ratio is divided into a domain of a duty ratio requiring the precision of the resolution and a domain of a duty ratio not particularly requiring the precision of the resolution to control the duty ratio with high precision in a user domain where a high range of the duty ratio.

Further, in the embodiment, since a setting unit of the duty ratio is 0.5%, when the domain of the duty ratio of the channel 1 is selected, approximately 102 digits, that is, approximately 500 mV may be allocated to 0.5% and the error by noise, and the like may be excluded.

Further, since the resolution of the channel 1 is 0.01%, the duty ratio may be controlled by setting the setting unit of the duty ratio of the channel 1 to 0.5% or less. In addition, in the embodiment, the example in which the use domain of the duty ratio is divided into two has been described, but the use domain of the duty ratio may be divided into two or more. As the number of divisions is increased, the resolution of the each use domain may be improved.

Further, in the embodiment, the analog voltage value has been in the use range of 0 to 10 V, but since the resolution is improved similarly even in a predetermined use range, the present invention may be applied even in the predetermined voltage range as the use range of the analog voltage value and the same effect as the present invention is obtained.

Figure 6A:
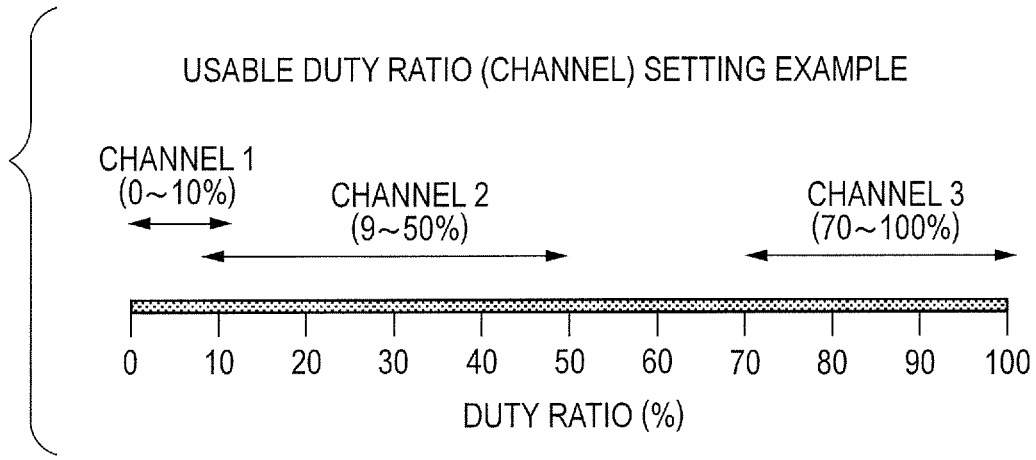
FIG. 6A is a diagram illustrating a setting example of a channel in the first embodiment.

Further, in the embodiment, the example in which the use domain of the duty ratio is divided into two has been described, but the use domain of the duty ratio may be extended by combining two or more different duty ratio domains, as illustrated in FIG. 6A. As such, by combining the different duty ratio domains, the use domain of the duty ratio may be extended and control precision of the respective duty ratio domains may be improved.

Further, when the on-time of the time-modulated intermittent radio frequency bias power is short, it is difficult to match the radio frequency bias power. The on-time is determined by the duty ratio and the repetition frequency, but in the case where the repetition frequency is a high frequency of 2000 Hz, when the duty ratio is low, the on-time is too short, which influences matching performance and may disable the radio frequency bias power to be applied to the sample holder 111.

As a result, when the duty ratio of the duty ratio domain of the channel 1 is used, it is preferable to generally use the repetition frequency of 200 Hz or less. Further, in order to prevent an influence on matching due to the short on-time, it is preferable to set a minimum value of the on-time when an excellent operation is available in advance and provide a function to judge whether to exert an influence on matching or whether there is the on-time.

Subsequently, a plasma processing method of etching the wafer 112 by using the microwave ECR plasma etching apparatus according to the embodiment will be described. Further, the plasma processing method will be described, when the use range of the duty ratio of the time-modulated intermittent radio frequency bias is divided into two duty ratio domains and constituted by two duty ratio domains of the channel 1 (0 to 10%) and the channel 2 (10.5 to 100%).

The time-modulated intermittent radio frequency bias is used to control the concentration of the reaction product and control etching performance, but a large effect is acquired particularly when the off-time is equivalent to the residence time of the reaction product. Etching is performed and the reaction product is continuously generated during a period of the on-time of the time-modulated intermittent radio frequency bias. When the time-modulated intermittent radio frequency bias is turned off, etching is not performed and the reaction product is exhausted. In the case of the general plasma etching apparatus, the residence time of the reaction product is in the range of 10 ms to 1000 ms at processing pressure in the range of 0.1 Pa to 10 Pa.

Figure 7A:
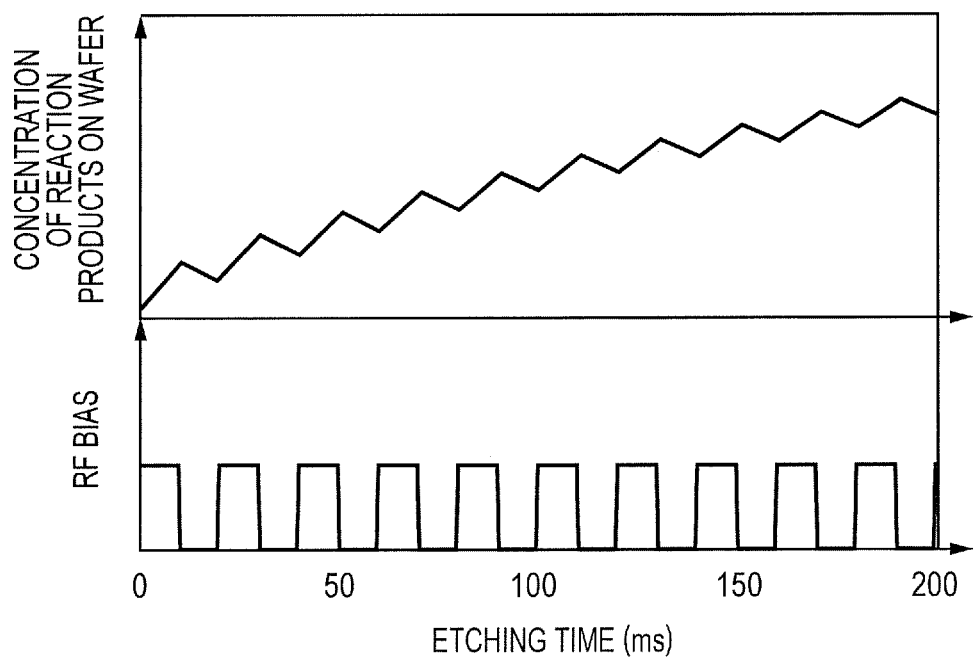
FIG. 7A is a diagram illustrating dependency of the concentration of a reaction product on an etching time.
Figure 7B:
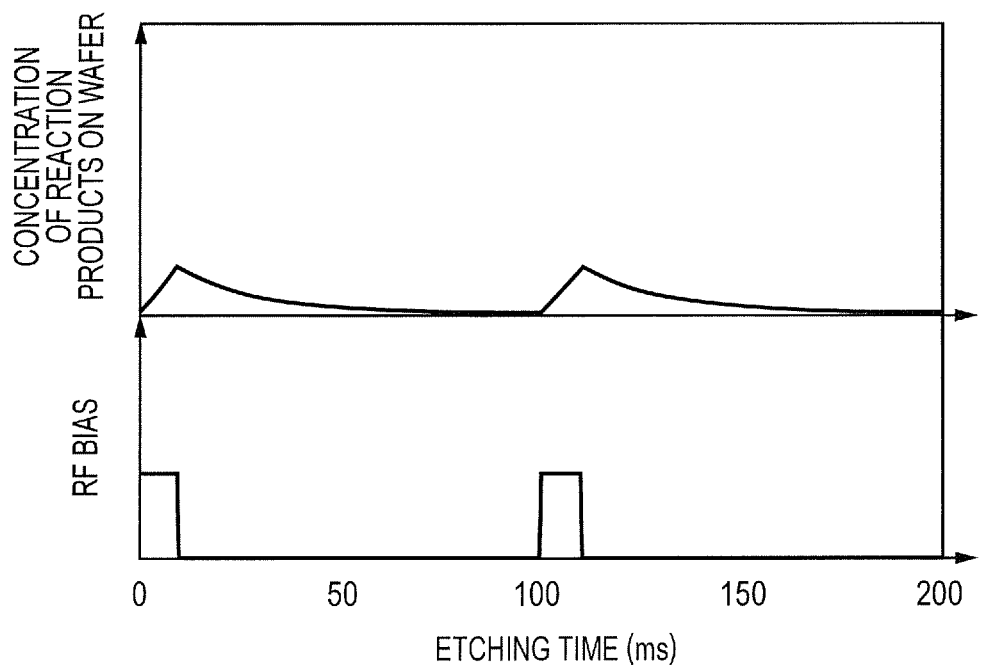
FIG. 7B is a diagram illustrating dependency of the concentration of a reaction product on an etching time.

As one example, a case in which the residence time of the reaction product is 80 ms will be described. In the continuous radio frequency bias, the concentration of the reaction product increases more monotonously than that at the time of starting etching. Etching time dependency of the concentration of the reaction product is illustrated in FIG. 7A, when the residence time of the reaction product is 80 ms, the on-time of the time-modulated intermittent radio frequency bias is 10 ms, and the off-time is 10 ms. When the off-time is shorter than the residence time of the reaction product, the reaction product remains, and thus the concentration of the reaction product increases as time elapsed. Subsequently, etching time dependency of the concentration of the reaction product is illustrated in FIG. 7B, when the residence time of the reaction product is the same as the off time by setting the residence time of the reaction product to 80 ms, the on-time of the time-modulated intermittent radio frequency bias to 10 ms, and the off-time to 80 ms.

Since the reaction product generated within the on-time is exhausted during the off-time and does not remain, the concentration of the reaction product may be made to be low. The concentration of the reaction product may be lowered by providing a sufficiently long off-time with respect to the reaction product generated during the on-time. Since the duty ratio is a ratio between the on-time and the off-time, lengthening the off-time is equivalent to lowering the duty ratio. An influence of the reaction product may be suppressed by lowering the duty ratio.

Figure 8A:
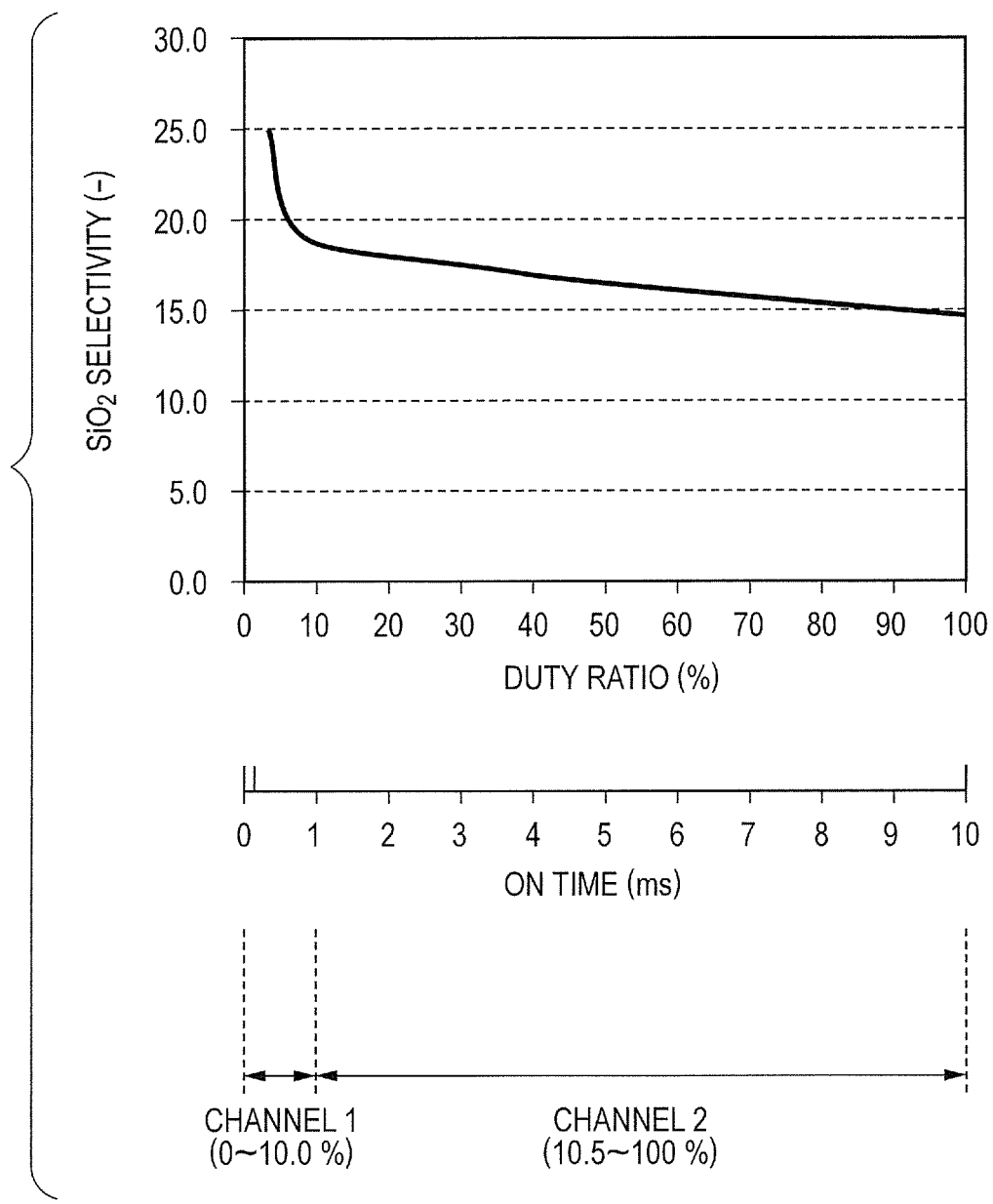
FIG. 8A is a diagram illustrating a $SiO_2$ selectivity to a duty ratio in the first embodiment.

Subsequently, FIG. 8A illustrates dependence of a selectivity of a $SiO_2$ film, which is a hard mask, on a duty ratio when Ar gas, $SF_6$ gas, and $O_2$ gas are mixed and a line pattern of tungsten is etched by fixing the repetition frequency to 10 Hz.

A change in the selectivity is gentle when the duty ratio is higher than 10%, but the selectivity is rapidly raised when the duty ratio is equal to or less than 10%. The reason is that the on-time is short and the off-time is long when the duty ratio is low, and thus the concentration of the reaction product decreases. It is considered that a reaction product when tungsten is etched with $SF_6$ gas is generally $WF_x$ (x=1 to 6), and the like, but F (fluorine) is generated by redissociating the reaction products thereof, attached to the $SiO_2$ film, reacts as $SiF_4$, and the like, and etched with $SiO_2$ to lower a $SiO_2$ selectivity.

The duty ratio of 10% or less needs to be controlled with high precision in order to control the selectivity with high precision. To this end, a channel of a duty ratio is divided into two domains of a channel of 10% or less and a channel higher than 10% as illustrated in FIG. 8A to perform both a wide control and a high-precision control.

Further, a plasma processing method other than the above method will be described below. By controlling the time-modulated intermittent radio frequency bias with high precision, the etching performance may be controlled with high precision. The etching performance may be changed with variation as time elapsed in a chamber.

For example, in the case where the etching rate deteriorates whenever processed sheets overlap with each other, set values of the processing time are the same as each other, and as a result, a total etching amount decreases and a failure may be caused. Accordingly, on the contrary, by increasing the etching rate whenever the processed sheets overlap with each other, the total etching amount may be constant. By controlling the on-time, the off-time, the frequency, the duty ratio, and the like of the time-modulated intermittent radio frequency bias with high precision, the etching performance may be controlled as time elapsed.

Figure 12:
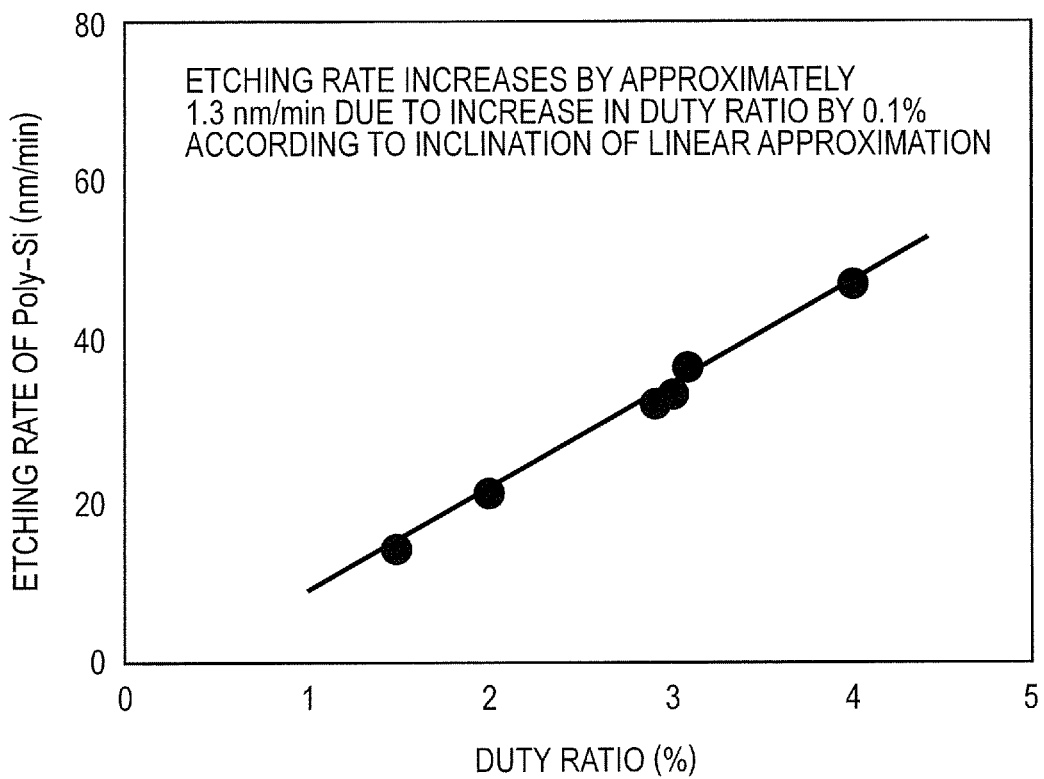
FIG. 12 is a diagram illustrating dependency of an etching rate of Poly-Si on a duty ratio.
Figure 13:
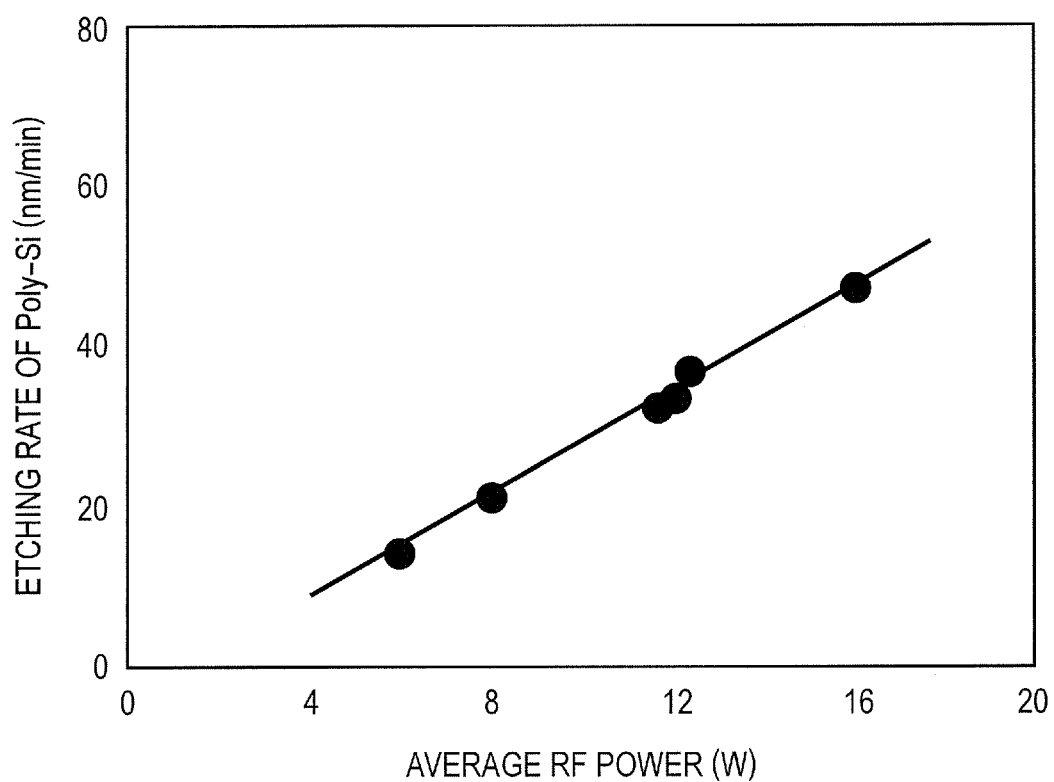
FIG. 13 is a diagram illustrating dependency of an etching rate of Poly-Si on an average radio frequency power.

FIG. 13 illustrates the relationship between an etching rate and average radio frequency power of Poly-Si. It can be seen that even a slight etching rate which is smaller than 20 nm/min may be controlled by changing the average radio frequency power. In FIG. 13, the duty ratio and the radio frequency power value illustrated in FIG. 12 are converted into the average radio frequency power.

As illustrated in FIG. 13, the average radio frequency power may be controlled by changing the duty ratio. Accordingly, since the etching rate may be controlled with high precision by controlling the duty ratio with high precision, the etching performance may be appropriately controlled as time elapsed.

Further, in the plasma processing method, the use frequency range of the duty ratio of the time-modulated intermittent radio frequency bias is divided into two domains, but even when the use domain of the duty ratio is divided into two or more, the same effect as the plasma processing method is acquired.

Further, even when the use domain of the duty ratio, the repetition frequency, the on-time, and the off-time is formed by combining two or more different domains, the same effect as the plasma processing method is acquired.

Since the present invention has the above configuration, the time-modulated intermittent radio frequency bias power may be supplied to a sample holder by the duty ratio controlled by a wide duty ratio with high precision, and thus etching may be performed with high precision in various etching processes.

Figure 9:
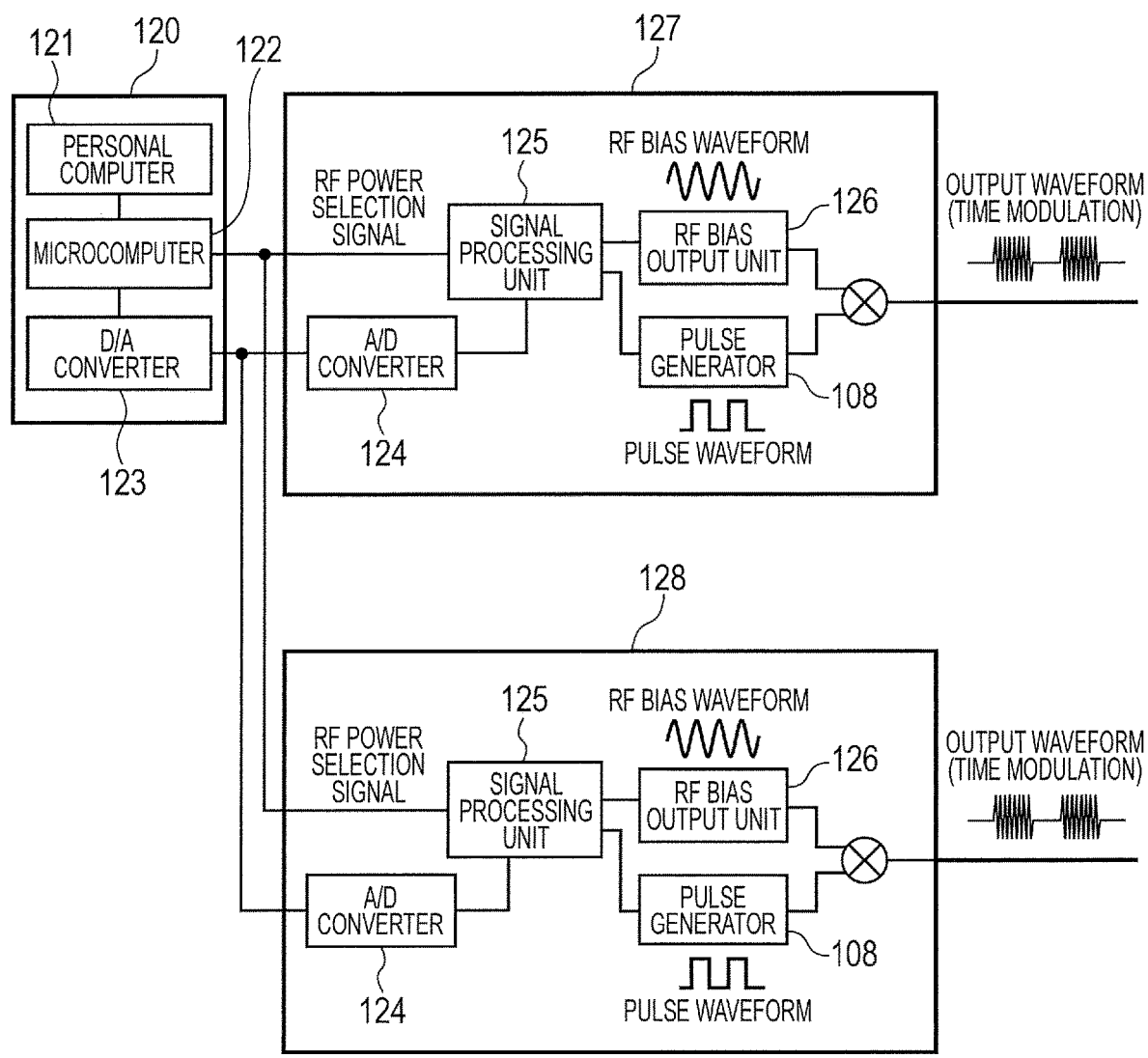
FIG. 9 is a schematic diagram of a controller and a radio frequency power supply according to the embodiment of the present invention.

Further, in the embodiment, the plurality of channels of the duty ratio have been switched by using the channel switching signals, but a method using a plurality of radio frequency bias power supplies may also be adopted. For example, when the channel of the duty ratio is divided into two as illustrated in FIG. 9, two radio frequency power supplies that output the time-modulated intermittent radio frequency bias power at duty ratios in different control ranges are provided, respectively, and a first radio frequency power supply 127 and a second radio frequency power supply 128 are switched to each other by a radio frequency power supply selection signal to thereby supply the time-modulated intermittent radio frequency bias power of the duty ratio controlled by the wide duty ratio with high precision to the placing electrode.

Figure 10:
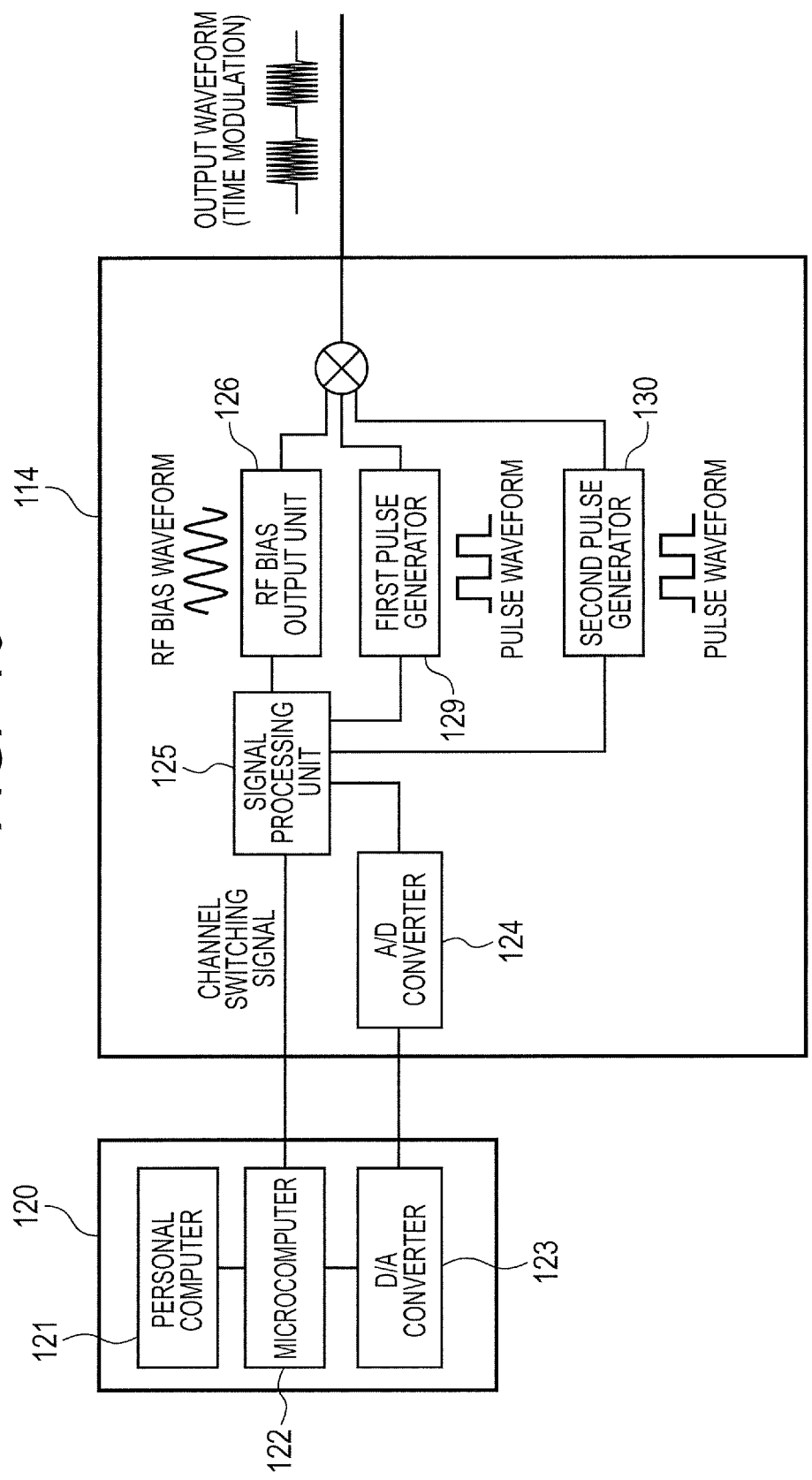
FIG. 10 is a schematic diagram of a controller and a radio frequency bias power supply according to the embodiment of the present invention.
Figure 11:
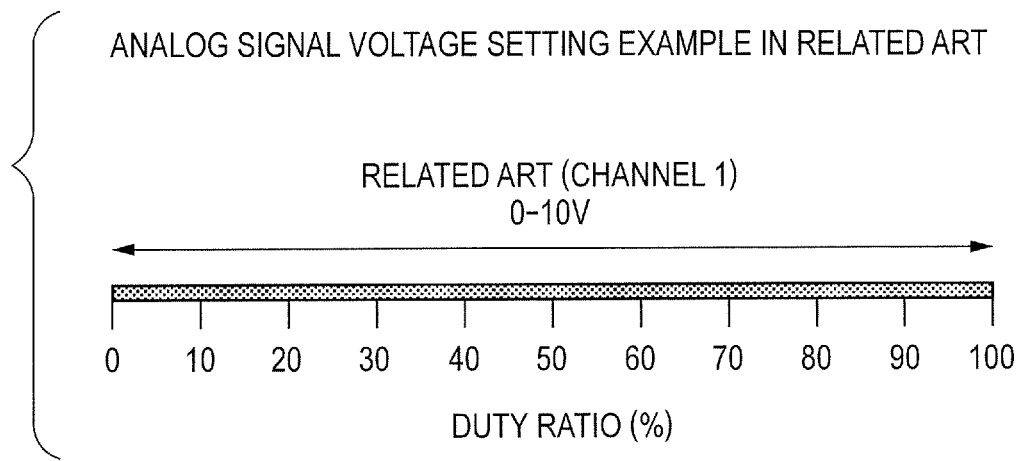
FIG. 11 is a diagram illustrating an example of setting an analog signal in the related art.

Further, as illustrated in FIG. 10, a plurality of pulse generators (a first pulse generator 129 and a second pulse generator 130, and the like) that generate pulse waveforms of the duty ratios in the different control ranges, respectively may be provided in the radio frequency bias power supply, instead of the plurality of radio frequency power supplies. Subsequently, when the radio frequency power supplied from the radio frequency power supply that supplies the radio frequency power to the sample is time-modulated and the repetition frequency is set as the control parameter, an embodiment in which the repetition frequency domain 1 constituted by the domains A and C and the repetition frequency domain 2 constituted by the domains B and D are set as the control domain will be described below.

Second Embodiment

Hereinafter, an embodiment of the present invention will be described with reference to the accompanying drawings. FIG. 1 is a schematic longitudinal cross-sectional view of an ECR plasma etching apparatus using a microwave according to an embodiment of the present invention. Further, like reference numerals refer to like elements.

A shower plate 102 (made of, for example, quartz) for introducing etching gas into a vacuum chamber 101 and a dielectric window 103 (made of, for example, quartz) are installed and sealed to form a processing chamber 104, above the vacuum chamber 101 of which the top is opened. A gas supplying device 105 for making the etching gas flow is connected to the shower plate 102. Further, a vacuum exhaust device 106 is connected to the vacuum chamber 101 through an exhaust opening/closing valve 117 and an exhaust speed variable valve 118. The processing chamber 104 is depressurized by driving the vacuum exhaust device 106 with the exhaust opening/closing valve 117 being opened, to be in a vacuum state.

The pressure in the processing chamber 104 is adjusted to desired pressure by the exhaust speed variable valve 118. The etching gas is introduced into the processing chamber 104 from the gas supplying device 105 through the shower plate 102 and exhausted by the vacuum exhaust device 106 through the exhaust speed variable valve 118. A sample holder 111 which is a sample stage is provided in a lower part of the vacuum chamber 101 which faces the shower plate 102.

In order to transmit power for generating plasma to the processing chamber 104, a waveguide 107 configured to transmit an electromagnetic wave is provided above the dielectric window 103. The electromagnetic wave transmitted to the waveguide 107 is oscillated from an electromagnetic wave generation power supply 109. Further, an effect of the embodiment is not particularly limited to a frequency of the electromagnetic wave, but in the embodiment, a microwave of 2.45 GHz is used. A magnetic field generation coil 110 forming a magnetic field is provided outside the processing chamber 104, and high-density plasma is generated in the processing chamber 104 by interaction of the electromagnetic wave oscillated from the electromagnetic wave generation power supply 109 and the magnetic field formed by the magnetic field generation coil 110, and etching processing is performed with respect to a wafer 112 which is a sample disposed on the sample holder 111.

Since the shower plate 102, the sample holder 111, the magnetic field generation coil 110, the exhaust opening/closing valve 117, the exhaust speed variable valve 118, and the wafer 112 are coaxially disposed on a central axis of the processing chamber 104, the flow of the etching gas, the radicals and ions generated by plasma, and the reaction product generated by etching are introduced and exhausted axially with respect to the wafer 112. The coaxial disposition provides an effect to approximate wafer in-plane uniformity of an etching rate and an etching profile to axial symmetry and improve wafer processing uniformity.

The surface of the sample holder 111 is coated with a sprayed film (not illustrated) and a DC power supply 116 is connected to the sample holder 111 through a radio frequency filter 115. Further, a radio frequency bias power supply 114 is connected to the sample holder 111 through a matching circuit 113. The radio frequency bias power supply 114 includes a radio frequency bias output unit 126 and a pulse generator 108 (see FIG. 2), and may selectively supply time-modulated intermittent radio frequency power or continuous radio frequency power to the sample holder 111.

Further, the time-modulated intermittent radio frequency bias power is controlled by a repetition frequency which is the number of times when an application period (on-period) of the radio frequency bias power and a non-application period (off-period) of the radio frequency bias power are repeated per unit time and a duty ratio which is an on-period per one cycle (the reciprocal of the repetition frequency).

A controller 120 that controls etching processing using the aforementioned ECR etching apparatus includes a personal computer 121 that processes a repetition frequency, a duty ratio, and etching parameters such as a gas flow rate, processing pressure, microwave power, coil current, and the like to perform etching, which are input by an input means (not illustrated), a microcomputer 122 that performs signal processing, and a digital/analog converter (hereinafter, referred to as a D/A converter 123) that converts a digital signal into an analog signal (see FIG. 2).

Further, the radio frequency bias power supply 114 includes an analog/digital converter (hereinafter, referred to as an A/D converter 124) that converts the analog signal into the digital signal, a signal processor 125 that processes a signal transmitted from the microcomputer 122 and a signal transmitted from the A/D converter 124, the pulse generator 108 that generates pulse waveforms of the repetition frequency and the duty ratio commanded from the signal processor 125, and the radio frequency bias output unit 126 that outputs radio frequency bias commanded from the signal processor (see FIG. 2).

Hereinafter, a function of the controller 120 when the time-modulated intermittent radio frequency power is supplied from the radio frequency bias power supply 114 to the sample holder will be described with reference to FIG. 2.

The repetition frequency and the duty ratio which are input into the personal computer 121 by the input means (not illustrated) are processed by the microcomputer 122 as the digital signals and converted into the analog signals through the D/A converter 123 to be transmitted to the radio frequency bias power supply 114.

The analog signals received by the radio frequency bias power supply 114 are converted into the digital signals by the A/D converter 124, which are processed by the signal processor 125, and as a result, the radio frequency bias power and the pulse waveform are output from the radio frequency bias output unit 126 and the pulse generator 108, respectively. The output pulse waveform overlaps with the output radio frequency bias power to supply the time-modulated intermittent radio frequency power from the radio frequency bias power supply 114 to the sample holder 111.

Subsequently, a case in which the repetition frequency of the radio frequency bias power supply 114 is used by setting the range of 1 to 2000 Hz every 1 Hz, and particularly, a case where a frequency band of 1 to 119 Hz is controlled with high resolution will be described.

The frequency band of 1 to 119 Hz is set as a channel 1 and a frequency band of 120 to 2000 Hz is set as a channel 2. Further, the D/A converter 123 and the A/D converter 124 of 12 bits are used, and a voltage value of the analog signal is set to a range of ±10 V. In addition, when the analog signal is in the range of ±10 V, the analog signal of 0 to 10 V is generally used.

Figure 3B:
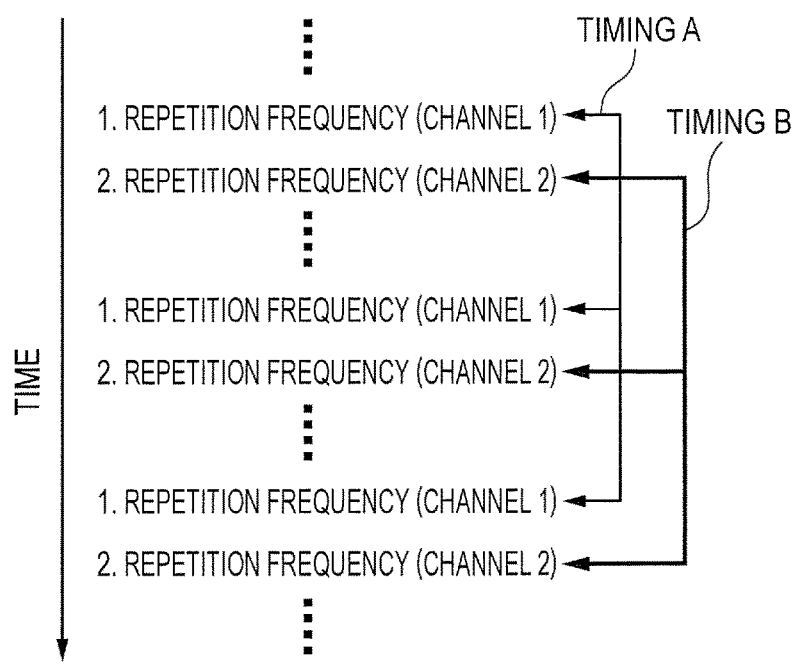
FIG. 3B is a diagram illustrating transmission of an analog signal in a second embodiment.

For example, when a repetition frequency of 60 Hz is input into the personal computer 121, both signals of the channel 1 and the channel 2 are periodically transmitted to the A/D converter 124 from the microcomputer 122 through the D/A converter 123 with timings of both sides deviating from each other, as illustrated in FIG. 3B.

The signal processor 125 selects the signal of the channel 1 from the signals of the channel 1 and the channel 2 transmitted from the A/D converter 124 by synchronizing a timing A (the channel 1) and signal reception with each other according to a channel switching signal for selecting the channel 1 transmitted from the microcomputer 122. The signal processor 125 that selects the signal of the channel 1 generates a pulse waveform of 60 Hz from the pulse generator 108 and outputs time-modulated intermittent radio frequency power of the repetition frequency of 60 Hz from the radio frequency bias power supply 114.

Figure 4B:
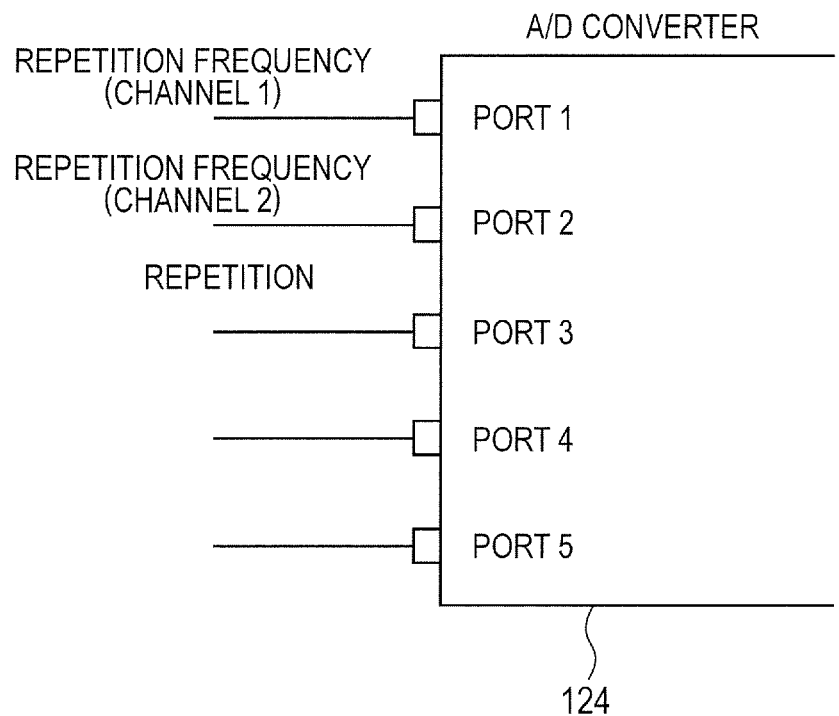
FIG. 4B is a schematic diagram of an A/D converter in the second embodiment.

Further, as another method for the signal processor 125 to selecting the channel, a method of judging which channel will be selected by the channel switching signal and acquiring a signal of a predetermined port may be used when a plurality of input/output terminals (hereinafter, referred to as ports) is provided in the A/D converter 124, as illustrated in FIG. 4B. For example, in the case of the repetition frequency of 60 Hz, the signal processor 125 is judged to select a port 1 (FIG. 4B).

Further, only a used channel may be transmitted to the A/D converter 124 from the microcomputer 122 through the D/A converter 123. For example, when a repetition frequency of 10 Hz is set, only the signal of the channel 1 is transmitted and the signal of the channel 2 is not transmitted. When the A/D converter 124 has a configuration illustrated in FIG. 4B, the signal processor 125 judges whether there is a reception signal of a port and thus may select the port 1, that is, the channel 1 in a state in which the port 1 has a signal and the port 2 has no signal. In this case, since the channel switching signal is not required, the A/D converter 124 may have a configuration of FIG. 5.

However, etching may be continuously processed in a plurality of steps, and when frequencies (different channels) of different frequency bands are used between the respective steps, the channel may be changed more rapidly in the method (FIG. 4B) of selecting the channel by using the switching signal in the state in which signals of different channels are transmitted periodically at all times while transmission timings deviate from each other than a method not requiring the switching signal, and thus the channel selecting method of FIG. 4B is appropriate.

Subsequently, frequency resolutions of the channel 1 and the channel 2 in the embodiment will be described.

In general, the frequency resolution is determined by processing capability and ranges of the frequency bands of the D/A converter 123 and the A/D converter 124. The D/A converter 123 and the A/D converter 124 of 12 bits may handle signals of 4096 digits. The digit means a binary digit number. In this case, signal value of 4096 types may be handled in the range of the analog signal of ±10 V. Since 0 to 10 V is generally used as the analog signal, signal values of 2048 types may be handled. In the embodiment, since a use range of the repetition frequency of the channel 1 is 1 to 119 Hz, the resolution is approximately 0.058 Hz. Further, since a use range of the repetition frequency of the channel 2 is 120 to 2000 Hz, the resolution is approximately 0.92 Hz.

In addition, since the use range of the analog signal is 10 V and the signals of 2048 digits may be handled, one digit corresponds to approximately 4.9 mV. That is, when the analog signal is at approximately 4.9 mV, the repetition frequency shows approximately 0.058 Hz in the case of the channel 1 and the repetition frequency shows approximately 0.92 Hz in the case of the channel 2. As a result, when an error of 4.9 mV occurs in the analog signal, an error of approximately 0.058 Hz occurs in the case of the channel 1 and an error of approximately 0.92 Hz occurs in the case of the channel 2.

For example, when the repetition frequency is 10 Hz (channel 1) and the duty ratio is 10%, the off-time is 90 ms. When noise of approximately 0.05% (5 mV) occurs in the analog signal, an error of approximately 0.058 Hz or more occurs in the repetition frequency. When the repetition frequency is 10.058 Hz and the duty ratio is 10%, the off-time is 89.5 ms and the error is just 0.56%. Further, when the repetition frequency is 1000 Hz (channel 2) and the duty ratio is 10%, the off-time is 0.9 ms. When noise of approximately 0.05% (5 mV) occurs in the analog signal by noise, the analog signal is processed as a signal of approximately 1001 Hz, and the off-time is 0.899 ms and the error is 0.001 ms, and thus the error is just 0.1%.

Accordingly, in the embodiment, as described above, by dividing the use frequency range of the repetition frequency into the frequency band requiring the precision of the resolution and the frequency band not particularly requiring the precision of the resolution, the repetition frequency may be controlled with high precision in a wide frequency band of the repetition frequency.

Further, in the embodiment, since a setting unit of the repetition frequency is 1 Hz, when the frequency band of the channel 1 is selected, approximately 20 digits may be allocated to 1 Hz and the error by noise, and the like may be excluded.

Further, since the resolution of the channel 1 is 0.058 Hz, the repetition frequency may be controlled by setting the setting unit of the repetition frequency of the channel 1 to 1 Hz or less.

Further, in the embodiment, the example in which the frequency band of the repetition frequency is divided into two has been described, but the frequency band may be divided into two or more. As the number of divisions is increased, the resolution of each frequency band may be improved.

Figure 6B:
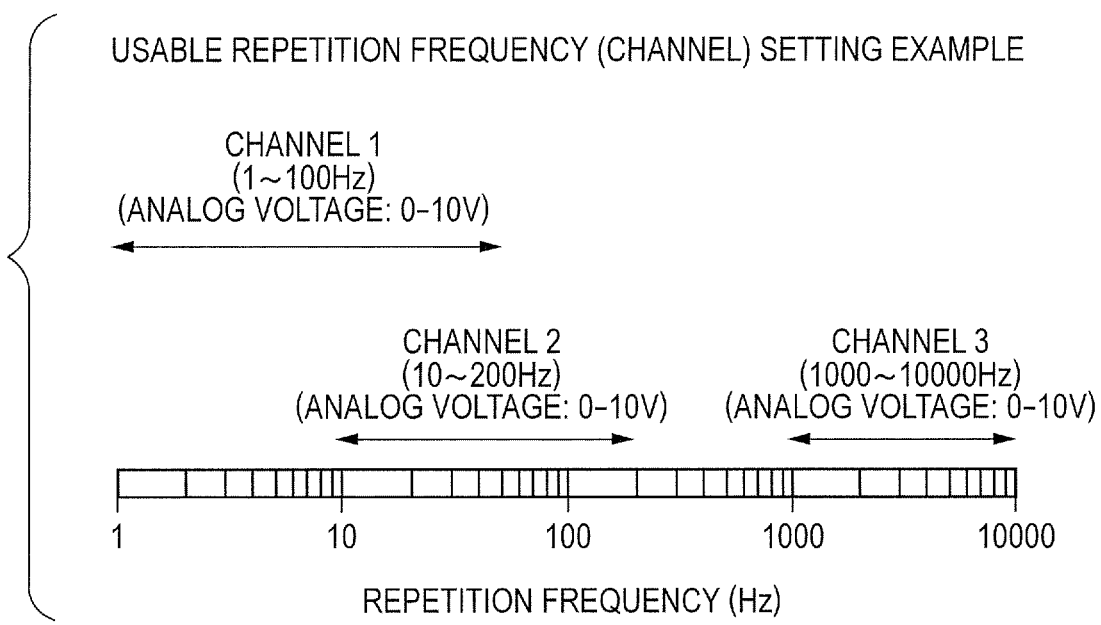
FIG. 6B is a diagram illustrating a setting example of a channel in the second embodiment.

Further, in the embodiment, the example in which the frequency band of the repetition frequency is divided into two has been described, but the use frequency range of the repetition frequency may be extended by combining two or more different frequency bands, as illustrated in FIG. 6B. As such, the use frequency range of the repetition frequency is extended by combining different frequency bands to thereby improve the precision of each frequency band.

In addition, in the embodiment, the analog voltage value has been in the use range of 0 to 10 V, but since the resolution is improved similarly even in a predetermined use range, the present invention may be applied even in the predetermined voltage range as the use range of the analog voltage value and the same effect as the present invention is obtained.

Further, when the on-time of the time-modulated intermittent radio frequency bias power is short, it is difficult to match the radio frequency bias power. The on-time is determined by the duty ratio and the repetition frequency, and in the case of a low duty ratio of 20% or less, the on-time of the repetition frequency in the radio frequency band of the channel 2 is too short, and thus the radio frequency bias power may not be applied to the sample holder 111. As a result, when the repetition frequency in the frequency band of the channel 2 is used, it is preferable to use the duty ratio of 20% or more.

Subsequently, a plasma processing method of etching the wafer 112 by using the microwave ECR plasma etching apparatus according to the embodiment will be described.

Further, the plasma processing method will be described, when the use frequency range of the repetition frequency of the time-modulated intermittent radio frequency bias is divided into two frequency bands and constituted by two frequency bands of the channel 1 (1 to 119 Hz) and the channel 2 (120 to 2000 Hz).

The time-modulated intermittent radio frequency bias is used to control the concentration of the reaction product and control etching performance, but a large effect is acquired particularly when the off-time is equivalent to the residence time of the reaction product. Etching is performed and the reaction product is continuously generated during a period of the on-time of the time-modulated intermittent radio frequency bias. When the time-modulated intermittent radio frequency bias is turned off, etching is not performed and the reaction product is exhausted. In the case of the general plasma etching apparatus, the residence time of the reaction product is in the range of 10 ms to 1000 ms at processing pressure in the range of 0.1 Pa to 10 Pa.

As one example, a case in which the residence time of the reaction product is 80 ms will be described. In the continuous radio frequency bias, the concentration of the reaction product increases more monotonously than that at the time of starting etching. Etching time dependency of the concentration of the reaction product is illustrated in FIG. 7A, when the residence time of the reaction product is 80 ms, the on-time of the time-modulated intermittent radio frequency bias is 10 ms, and the off-time is 10 ms. When the off-time is shorter than the residence time of the reaction product, the reaction product remains, and thus the concentration of the reaction product increases as time elapsed.

Subsequently, etching time dependency of the concentration of the reaction product is illustrated in FIG. 7B, when the residence time of the reaction product is the same as the off time by setting the residence time of the reaction product to 80 ms, the on-time of the time-modulated intermittent radio frequency bias to 10 ms, and the off-time to 80 ms. Since the reaction product generated within the on-time is exhausted during the off-time and does not remain, the concentration of the reaction product may be made to be low. By setting the off-time to the residence time of the reaction product or more, the concentration of the reaction product may be lowered.

Figure 8B:
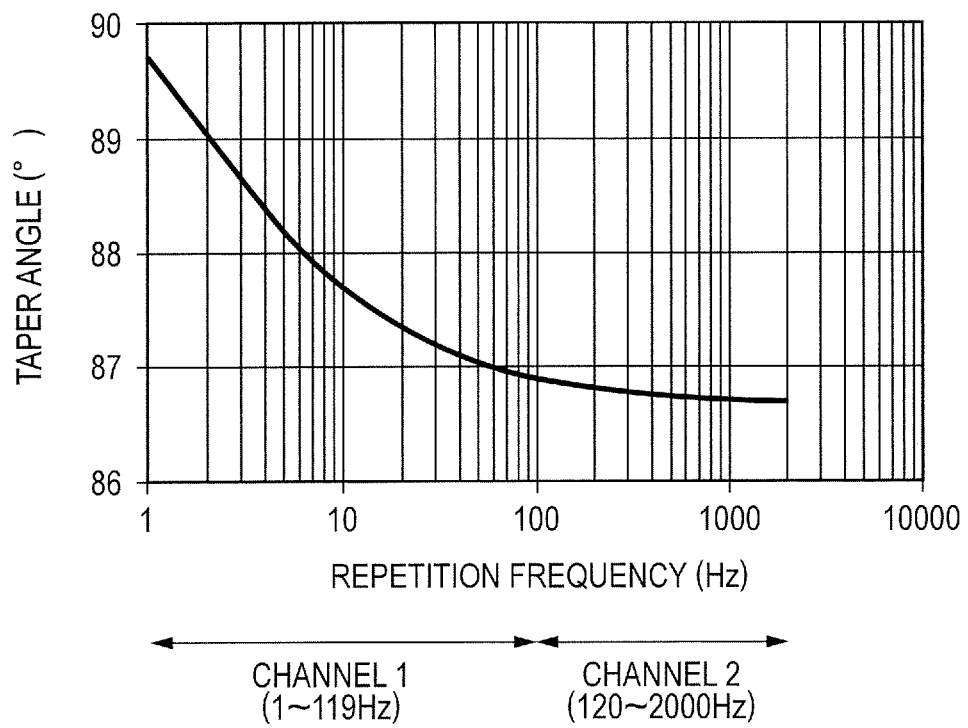
FIG. 8B is a diagram illustrating dependency of a tapered angle having an etching profile on a repetition frequency in the second embodiment.

Subsequently, FIG. 8B illustrates dependency of a tapered angle of an etching profile of a line on a repetition frequency when a line of a silicon nitride layer is etched by fixing a duty ratio to 20%. As the repetition frequency becomes low, the etching profile is close to verticality. The off-time is determined by the repetition frequency and the duty ratio, and the result of FIG. 8B is acquired because the off-time is lengthened, and thus the concentration of the reaction product is lowered and the amount of the reaction product attached is decreased.

Figure 8C:
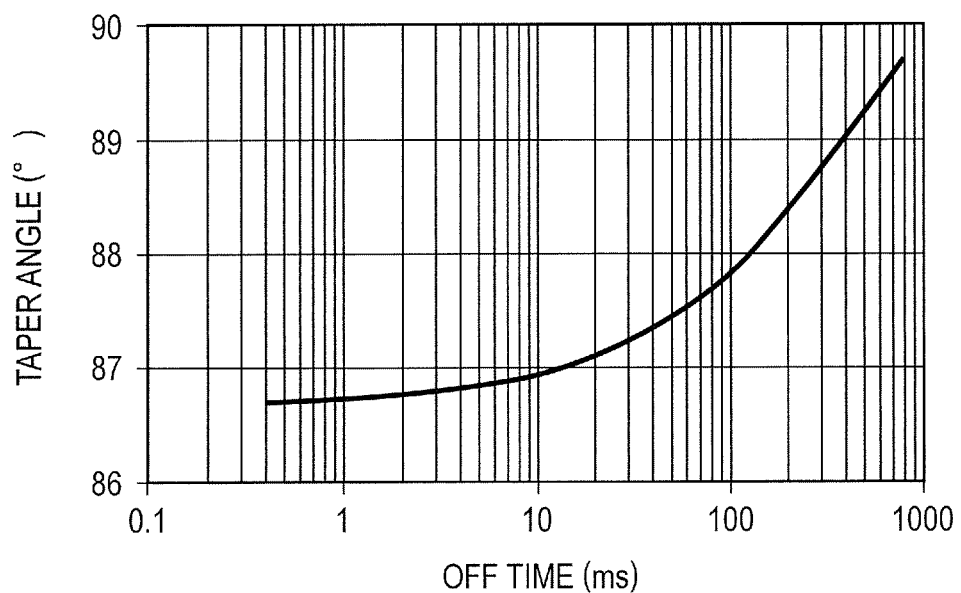
FIG. 8C is a diagram illustrating the dependency of the tapered angle having the etching profile on the tapered angle on an off time of intermittent radio frequency bias power which is time-modulated in the second embodiment.

FIG. 8C illustrates dependency of the tapered angle on the off-time instead of the dependency of the tapered angle on the repetition frequency in FIG. 8B and it can be seen from FIG. 8C that the tapered angle may be controlled by lengthening the off-time. In particular, an etching profile which is vertical in the off-time range of 10 to 1000 ms may be acquired.

As such, by setting the off-time to the residence time of the reaction product or more, the concentration of the reaction product may be reduced. In order to lengthen the off-time, the repetition frequency needs to be lowered and the duty ratio needs to be lowered. For example, FIG. 7B illustrates an example in which the wafer 112 is plasma-etched by applying the time-modulated intermittent radio frequency bias power, in which the repetition frequency is 11.1 Hz and the duty ratio is 11.1%, to the sample holder 111.

Accordingly, in the embodiment, even in the low-frequency repetition frequency band in which the off-time may be lengthened, the frequency may be controlled with high precision, and thus the concentration of the reaction product may be controlled with high precision. Therefore, the etching profile may be controlled with high precision.

Further, the radio frequency repetition frequency band may need to be used according to a type of an etched film, a target etching process, an etching condition, and the like. However, in the case of the radio frequency repetition frequency, since the on-time and the off-time are very short, the frequency resolution need not be particularly higher than that in the low-frequency repetition frequency.

Further, the type of the etching process is various and not vertical processing but the taper profile may be needed according to the process. For example, as the etching process, there is shallow trench isolation (STI) (hereinafter, referred to as STI) etching. After the STI etching, the taper profile is generally required for embedding. When the wafer is processed in the taper profile, the repetition frequency is preferably higher in the case where an etching characteristic as illustrated in FIG. 8B is provided. In order to extensively deal with various processes of semiconductor fabrication, it is preferable that the repetition frequency may be widely used.

Further, in the plasma processing method, the use frequency range of the repetition frequency of the time-modulated intermittent radio frequency bias is divided into two frequency bands, but even when the use frequency range of the repetition frequency is divided into two or more, the same effect as the plasma processing method is acquired.

Further, even when the use frequency range of the repetition frequency is configured by combining two or more different frequency bands, the same effect as the plasma processing method may be acquired.

Since the present invention has the above configuration, the time-modulated intermittent radio frequency bias power of the repetition frequency controlled with high precision in the wide frequency band may be supplied to the placing electrode, and thus etching may be performed with high precision in various etching processes.

Further, in the embodiment, the plurality of channels of the frequency band of the repetition frequency have been switched by using the channel switching signals, but a method using a plurality of radio frequency bias power supplies may also be adopted. For example, as illustrated in FIG. 9, in the case of two channels, two radio frequency power supplies that output the time-modulated intermittent radio frequency bias power at the repetition frequencies of different frequency bands are provided, respectively, and a first radio frequency power supply 127 and a second radio frequency power supply 128 are switched to each other by a radio frequency power supply selection signal to thereby supply the time-modulated intermittent radio frequency bias power of the repetition frequency controlled with high precision in the wide frequency band to the placing electrode.

Further, as illustrated in FIG. 10, a plurality of pulse generators (a first pulse generator 129 and a second pulse generator 130, and the like) that generate pulse waveforms of the repetition frequency in the different frequency bands, respectively may be provided in the radio frequency bias power supply, instead of the plurality of radio frequency power supplies.

Subsequently, an embodiment different from the second embodiment, in which the repetition frequency is controlled with high precision in the wide frequency band of the repetition frequency, will be described below.

Third Embodiment

In FIG. 8B, a change in tapered angle is large at the low repetition frequency and the change in tapered angle is small at the high repetition frequency. In this case, settable values may be limited and precision may be improved by setting the frequency every 1 Hz in the range of 1 to 10 Hz, every 10 Hz in the range of 10 to 100 Hz, and every 100 Hz in the range of 100 to 1000 Hz. In this method, as the number of settable frequencies increases, the precision becomes low and the degree of setting freedom is small.

Therefore, a method using a fundamental frequency has been developed. An embodiment thereof will be described below. In the configuration illustrated in FIG. 5, the repetition frequency is input into the personal computer 121 of the controller 120. The repetition frequency is calculated as an N layout with the fundamental frequency in the personal computer 121 and sent to the microcomputer 122. In the embodiment, the fundamental frequency is in the range of 0 to 100 Hz and is set every 1 Hz. The N layout is set to 1, 10, and 100 in the embodiment.

As described above, the D/A converter 123 and the A/D converter 124 of 12 bits according to the embodiment may handle signals of 4096 digits. The analog signal is in the range of 0 to 10 V in the embodiment and signal values of 2048 types may be handled. When the fundamental frequency may be set every 1 Hz in the range of 0 to 100 Hz, the fundamental frequency per one digit is approximately 0.05 and 20 digits may be allocated in order to set the fundamental frequency every 1 Hz.

Since one digit is 4.9 mV, 98 mV is allocated when the fundamental frequency is set every 1 Hz. The N layout includes three types of 1, 10, and 100 and may be divided into three, and resolutions of both analog voltage and allocated digits are significantly high. By adopting a method using a multiplication of the fundamental frequency and the N layout as the repetition frequency, the repetition frequency may correspond to 0 to 10000 Hz in the embodiment.

The frequency is set every 1 Hz in the range of 0 to 100 Hz, every 10 Hz in the range of 110 to 1000 Hz, and every 100 Hz in the range of 1100 to 10000 Hz. When sensitivity to the repetition frequency having a characteristic of etching performance is low in the case where the repetition frequency is high as described above, an influence is small even though a setting pitch is large as the repetition frequency becomes high. Further, in the embodiment, since the resolution is 0.05 Hz in the range of 0 to 100 Hz, 0.5 Hz in the range of 110 to 1000 Hz, and 5 Hz in the range of 1100 to 10000 Hz, and is much smaller than the setting pitch, a possibility that the analog signal will be influenced by noise is small.

For example, since 20 digits are allocated to 1 Hz at the setting pitch of 1 Hz in the range of 0 to 100 Hz, 98 mV is allocated to 1 Hz. That is, when 98 mV or more does not deviate in noise, an error of 1 Hz does not occur. When the repetition frequency corresponds to 0 to 10000 Hz in the related art, one digit is 4.9 Hz, and the noise is 4.9 mV and deviates by 4.9 Hz. By the method of the embodiment, the influence of noise may be significantly reduced. Hereinafter, a detailed example of setting will be described.

A case in which 1000 Hz is input as the repetition frequency will be described. A case in which 1000 Hz is input into the personal computer 121 of FIG. 5 will be described. When 1000 Hz is input into the personal computer 121 of FIG. 5, the fundamental frequency is 100 Hz and the N layout is 10. Although there is also a method of setting the fundamental frequency to 10 Hz and the N layout to 100 at the time of setting 1000 Hz, the fundamental frequency is preferred. Since a pitch or a setting range of a set value may be set and changed by a condition or hardware in the N layout, the fundamental frequency is preferably preferred in order to simplify a program of software.

Further, when only one is needed as the N layout, the signal line need not be used, and thus hardware is simplified, and even in this case, since handling may be performed without changing software, generalization of software is also high when the fundamental frequency is preferred.

Figure 14:
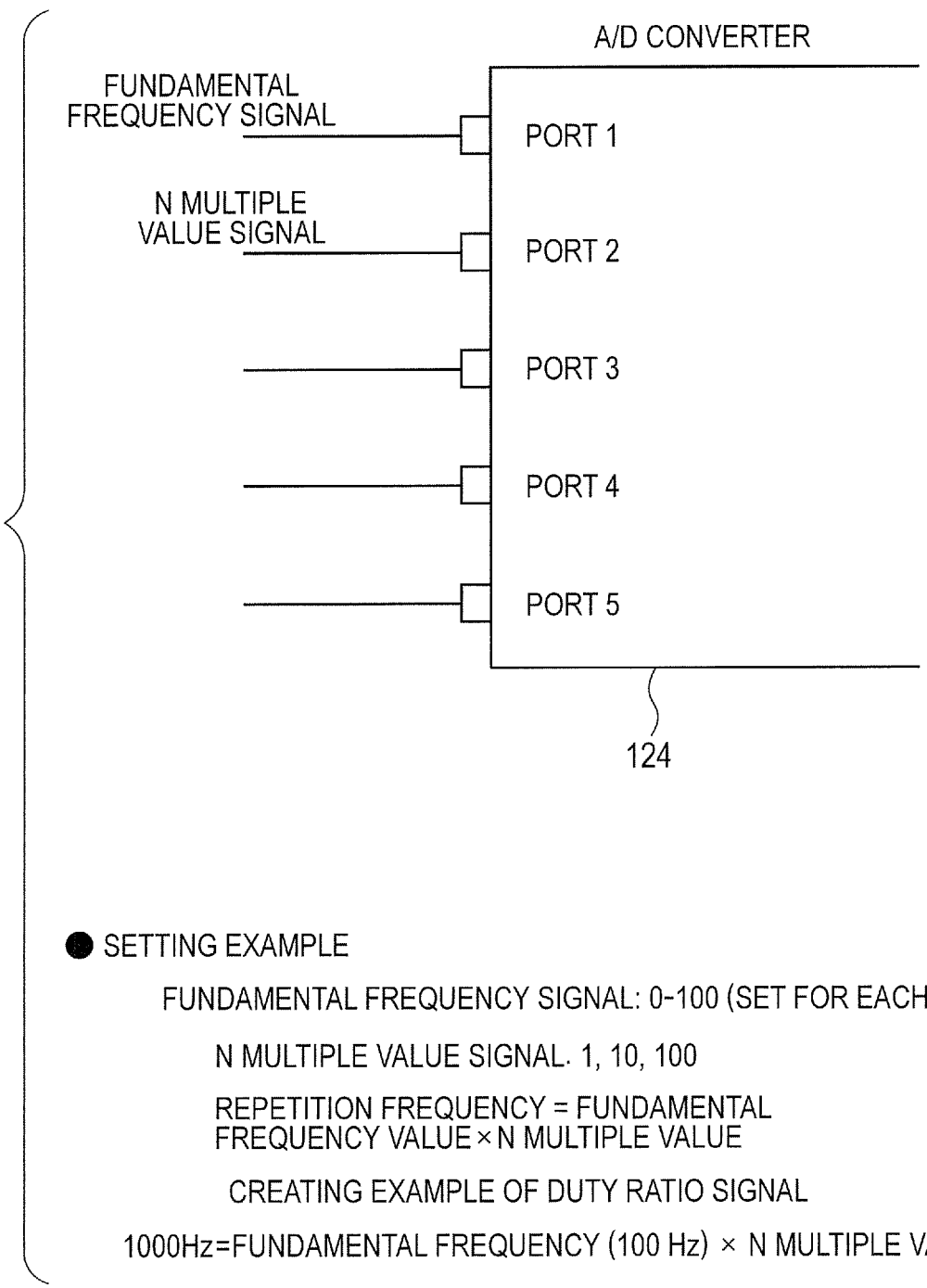
FIG. 14 is a schematic diagram of an A/D converter in a third embodiment.

The fundamental frequency and the N layout calculated in the personal computer 121 are input into the A/D converter 124 in the radio frequency power supply as illustrated in FIG. 14 via the D/A converter 123. A calculation of multiplying the fundamental frequency and the N layout is performed by using the signal processor in the radio frequency bias power supply 114, and the repetition frequency is determined.

Figure 2:
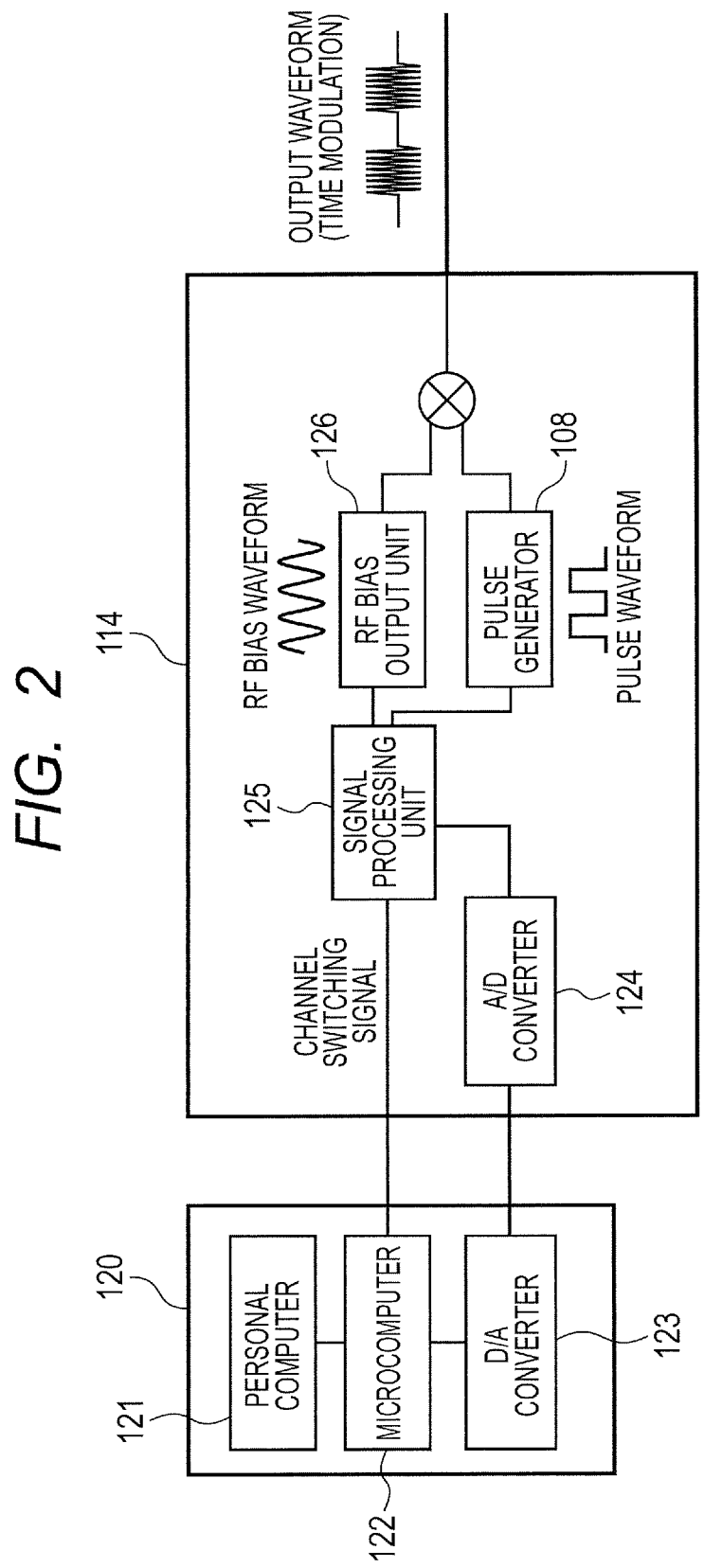
FIG. 2 is a schematic diagram of a controller and a radio frequency bias power supply according to the embodiment of the present invention.

Further, the N layout may be used as the channel switching signal illustrated in FIG. 2 or 10. When the fundamental frequency is in the range of 0 to 100 Hz and the N layout is set to 1 and 100, the repetition frequency may be calculated based on the fundamental frequency and the N layout by using the signal processor 125 by setting the N layout to 1 in the case of the channel 1 and the N layout to 100 in the case of the channel 2. Further, the N layout may be arbitrarily set.

When the N layout is two types of 1 and 100 as described above, the channel switching signal is two types, and thus the N layout may be set to 1 when the signal is in an on state and the N layout may be set to 100 when the signal is in an off state. In this case, the signal may be processed as not the analog signal but the digital signal and the resolution for the N layout may be significantly enhanced.

The embodiment is performed to improve the resolution of the repetition frequency, but the same means may be applied to the duty ratio or the on-time and the off-time and the resolutions of the duty ratio or the on-time and the off-time may also be improved. Further, the fundamental frequency or the N layout in the embodiment may not be an integer. Subsequently, a plasma processing method of plasma-etching a multilayered film by using the plasma processing apparatus according to the present invention will be described below.

Fourth Embodiment

Figure 16:
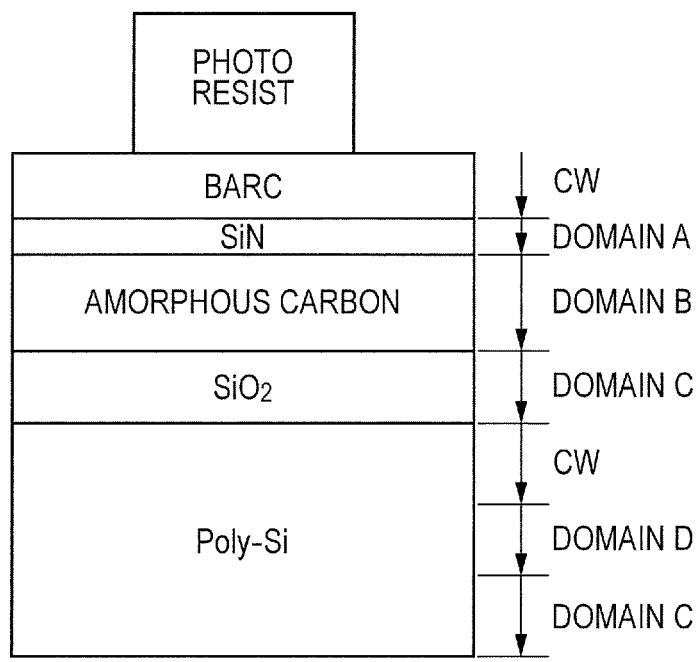
FIG. 16 is a diagram illustrating a method of processing plasma in a fourth embodiment.

The embodiment will be described with reference to FIG. 16. As illustrated in FIG. 16, when a multilayered film in which a Poly-Si film, a $SiO_2$ film, an amorphous carbon film, a SiN film, and a BARC film are stacked sequentially from the bottom and a sample disposed on the multilayered film and having a previously patterned resist mask are plasma-etched, the plasma-etching is performed as below.

First, the BARC film is etched by continuous wave radio frequency bias power (hereinafter, referred to as CW), and thereafter, the SiN film is etched by the time-modulated radio frequency bias power using a domain A.

Subsequently, the amorphous carbon film and the $SiO_2$ film are etched by time-modulated radio frequency bias power using a domain B and a domain C, respectively. Last, the Poly-Si film is etched by the CW and continuously, etched by time-modulated radio frequency bias power sequentially using a domain D and the domain C.

Further, as illustrated in FIG. 15, the domain A is a domain having a low repetition frequency (for example, a repetition frequency of 1 to 100 Hz) and a higher duty ratio than a low duty ratio (for example, a duty ratio of 10% or less) and the domain B is a domain having a higher repetition frequency than the low repetition frequency and the higher duty ratio than the low duty ratio. Further, the domain C is a domain having the low repetition frequency and the low duty ratio and the domain D is a domain having the higher repetition frequency than the low repetition frequency and the low duty ratio.

By performing the plasma processing, the multilayered film in which the Poly-Si film, the $SiO_2$ film, the amorphous carbon film, the SiN film, and the BARC film are stacked sequentially from the bottom and the sample disposed on the multilayered film and having the previously patterned resist mask may be etched in a desired profile with high precision.

As described above, the first to fourth embodiments have been described by using the duty ratio and the repetition frequency as the control parameters, but the present invention according to the first to fourth embodiments may be applied even to the on-time and the off-time. The reason is that the duty ratio and the repetition frequency may be acquired by using the on-time and the off-time.

For example, when the radio frequency power is time-modulated by controlling the on-time, the control domain is divided into at least two, and the high-precision control may be performed by setting an on-time of 1.0 ms or less as the channel 1 and an on-time longer than 1.0 ms as the channel 2, similarly as the duty ratio. Further, similarly as the on-time, it is possible to perform the high-precision control by dividing the off-time or the control domain into a plurality of domains.

Further, the configuration of the radio frequency bias power supply of the first to fourth embodiments may be applied even to a radio frequency power supply generating plasma. As a result, the present invention is a plasma processing apparatus that supplies the time-modulated radio frequency power, which is controllable with high precision in the wide repetition frequency band, from at least any one power supply of the radio frequency power supply generating plasma and the radio frequency bias power supply.

Further, in the first to fourth embodiments, the microwave ECR plasma has been described as one embodiment, but the same effects as the first to fourth embodiments are acquired even in a plasma processing apparatus in a method of generating other plasma such as capacitance-coupled plasma or inductance-coupled plasma.

What is claimed is:
1. A plasma processing apparatus, comprising:
   a vacuum chamber in which a sample is plasma processed;
   a first radio frequency power supply supplying a first radio frequency power to generate plasma in the vacuum chamber;
   a sample holder on which the sample is placed; a second radio frequency power supply supplying a second radio frequency power to the sample holder,
   a D/A converter converting a digital signal into an analog signal;
   an A/D converter converting an analog signal into a digital signal;
   wherein the D/A converter converts a set parameter for time modulation of the first radio frequency power into a first analog value corresponding to the set parameter and being a value relating to a first frequency band and a second analog value corresponding to the set parameter and being a value relating to a second frequency band wider than the first frequency band;
   a signal processor configured to select a first digital value that the first analog value is converted by the A/D converter or a second digital value that the second analog value is converted by the A/D converter, based on a signal to select the first frequency band or the second frequency band; and a pulse generator generating a pulse waveform for time modulation of the first radio frequency power based on the first digital value or the second digital value selected by the signal processor wherein a range of an analog voltage value of the first analog value is the same as a range of an analog voltage value of the second analog value.

2. The plasma processing apparatus according to claim 1, wherein:

the parameter is a duty ratio, and the pulse waveform is a pulse waveform of the duty ratio corresponding to the first digital value or the second digital value selected by the signal processor.

3. The plasma processing apparatus according to claim 1, wherein the signal processor selects the first digital value that the first analog value is converted by the A/D converter or the second digital value that the second analog value is converted by the A/D converter by synchronizing a timing and a signal reception according to the signal.

4. A plasma processing apparatus comprising:

a vacuum chamber in which a sample is plasma processed;

a first radio frequency power supply supplying a first radio frequency power to generate plasma in the vacuum chamber;

a sample holder on which the sample is placed;

a second radio frequency power supply supplying a second radio frequency power to the sample holder;

a D/A converter converting a digital signal into an analog signal;

an A/D converter converting an analog signal into a digital signal;

wherein the D/A converter converts a set parameter for time modulation of the second radio frequency power into a first analog value corresponding to the set parameter and being a value relating to a first frequency band and a second analog value corresponding to the set parameter and being a value relating to a second frequency band wider than the first frequency band;

a signal processor configured to select a first digital value that the first analog value is converted by the A/D converter or a second digital value that the second analog value is converted by the A/D converter based on a signal to select the first frequency band or the second frequency band; and a pulse generator generating a pulse waveform for time modulation of the second radio frequency power based on the first digital value or the second digital value selected by the signal processor wherein a range of an analog voltage value of the first analog value is the same as a range of an analog voltage value of the second analog value.

5. The plasma processing apparatus according to claim 4, wherein:

the parameter is a duty ratio, and the pulse waveform is a pulse waveform of the duty ratio corresponding to the first digital value or the second digital value selected by the signal processor.

6. The plasma processing apparatus according to claim 4, wherein the signal processor selects the first digital value that the first analog value is converted by the A/D converter or the second digital value that the second analog value is converted by the A/D converter by synchronizing a timing and a signal reception according to the signal.

7. A plasma processing apparatus, comprising:

a vacuum chamber in which the sample is plasma processed;

a first radio frequency power supply supplying a first radio frequency power to generate plasma in the vacuum chamber;

a sample holder on which the sample is placed;

a second radio frequency power supply supplying a second radio frequency power to the sample holder, a control device comprising an input section, a microcomputer, and a D/A converter converting a digital signal into an analog signal, wherein the D/A converter converts a set parameter for time modulation of the first radio frequency power into a first analog value corresponding to the set parameter and being a value of a first frequency band and a second analog value corresponding to the set parameter and being a value of a second frequency band wider than the first frequency band;

an A/D converter having a plurality of output ports thereon, the A/D converter configured to receive the first analog value and the second analog value, and to convert the first analog value and the second analog value transmitted by the control device to a first digital signal and a second digital signal respectively, wherein the A/D converter is further configured to output the first digital signal on the first output port and to output the second digital signal on the second output port;

a signal processor configured to select the first output port on which is output the first digital signal converted by the A/D converter or the second output port on which is output the second digital signal converted by the A/D converter based on a signal received by the signal processor from the control device, wherein the signal corresponds to the first and second digital signals, and wherein the signal is based on the first radio-frequency power;

a pulse generator generating a pulse waveform for time modulation of the first radio frequency power based on the first digital signal or the second digital signal selected by the signal processor, and wherein a range of an analog voltage value of the first analog value is the same as a range of an analog voltage value of the second analog value.

8. The plasma processing apparatus according to claim 7, wherein the signal processor selects the first digital signal that the first analog value is converted by the A/D converter or the second digital signal that the second analog value is converted by the A/D converter by synchronizing a timing and a signal reception according to the signal.

* * * * *